(12) United States Patent
Kado et al.

(10) Patent No.: US 8,653,655 B2
(45) Date of Patent: Feb. 18, 2014

(54) SEMICONDUCTOR DEVICE AND MANUFACTURING METHOD THEREOF

(71) Applicant: Renesas Electronics Corporation, Ka (JP)

(72) Inventors: Yoshiyuki Kado, Kodaira (JP); Takahiro Naito, Kodaira (JP); Toshihiko Sato, Kodaira (JP); Hikaru Ikegami, Koganei (JP); Takafumi Kikuchi, Higashiyamato (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/960,596

(22) Filed: Aug. 6, 2013

(65) Prior Publication Data

US 2013/0320571 A1 Dec. 5, 2013

Related U.S. Application Data

(60) Continuation of application No. 13/533,779, filed on Jun. 26, 2012, now Pat. No. 8,524,534, which is a continuation of application No. 12/565,747, filed on Sep. 23, 2009, now Pat. No. 8,278,147, which is a division of application No. 12/419,357, filed on Apr. 7, 2009, now Pat. No. 7,859,095, which is a division of application No. 11/399,365, filed on Apr. 7, 2006, now Pat. No. 7,531,441, which is a division of application No. 10/479,785, filed as application No. PCT/JP02/03434 on Apr. 5, 2002, now Pat. No. 7,042,073.

(30) Foreign Application Priority Data

Jun. 7, 2001 (JP) ................................ 2001-172503

(51) Int. Cl.
 *H01L 23/04* (2006.01)

(52) U.S. Cl.
 USPC .......... 257/730; 257/701; 257/702; 257/723; 257/724; 438/110; 438/125; 438/126

(58) Field of Classification Search
 USPC .......... 257/701–702, 723–724, 730; 438/110, 438/125–126
 See application file for complete search history.

(56) References Cited

U.S. PATENT DOCUMENTS

| 5,138,427 A | 8/1992 | Furuyama |
| 5,310,965 A | 5/1994 | Senba et al. |

(Continued)

FOREIGN PATENT DOCUMENTS

| EP | 1045443 | 10/2000 |
| JP | 64-023562 A | 1/1989 |

(Continued)

OTHER PUBLICATIONS

Office Action dated Dec. 20, 2011 in U.S. Appl. No. 13/053,410.

(Continued)

*Primary Examiner* — Bac Au
(74) *Attorney, Agent, or Firm* — Miles & Stockbridge P.C.

(57) ABSTRACT

Of three chips (2A), (2B), and (2C) mounted on a main surface of a package substrate (1) in a multi-chip module (MCM), a chip (2A) with a DRAM formed thereon and a chip (2B) with a flash memory formed thereon are electrically connected to wiring lines (5) of the package substrate (1) through Au bumps (4), and a gap formed between main surfaces (lower surfaces) of the chips (2A), (2B) and a main surface of the package substrate (1) is filled with an under-fill resin (6). A chip (2C) with a high-speed microprocessor formed thereon is mounted over the two chips (2A) and (2B) and is electrically connected to bonding pads (9) of the package substrate (1) through Au wires (8).

6 Claims, 38 Drawing Sheets

(56) References Cited

U.S. PATENT DOCUMENTS

| | | |
|---|---|---|
| 5,530,289 A | 6/1996 | Hirano et al. |
| 5,656,945 A | 8/1997 | Cain |
| 5,686,763 A | 11/1997 | Tokuno et al. |
| 5,962,917 A | 10/1999 | Moriyama |
| 6,054,338 A | 4/2000 | Lee et al. |
| 6,100,594 A | 8/2000 | Fukui et al. |
| 6,181,002 B1 | 1/2001 | Juso et al. |
| 6,329,228 B1 | 12/2001 | Terashima |
| 6,365,432 B1 | 4/2002 | Fukutomi et al. |
| 6,407,456 B1 | 6/2002 | Ball |
| 6,482,730 B1 | 11/2002 | Masumoto et al. |
| 6,486,052 B1 | 11/2002 | Sato |
| 6,509,638 B2 | 1/2003 | Fujimoto et al. |
| 6,602,734 B1 | 8/2003 | Wada et al. |
| 6,774,500 B1 | 8/2004 | Nakayama |
| 6,803,646 B2 | 10/2004 | Shibue |
| 6,841,881 B2 | 1/2005 | Katagiri et al. |
| 6,885,106 B1 | 4/2005 | Damberg et al. |
| 7,042,073 B2 | 5/2006 | Kado et al. |
| 7,531,441 B2 | 5/2009 | Kado et al. |
| 7,859,095 B2 | 12/2010 | Kado et al. |
| 8,278,147 B2 | 10/2012 | Kado et al. |
| 2001/0028107 A1 | 10/2001 | Wada et al. |
| 2001/0033018 A1 | 10/2001 | Kimura |
| 2001/0035575 A1 | 11/2001 | Miyazaki et al. |
| 2001/0038150 A1 | 11/2001 | Suzuki |
| 2002/0000327 A1 | 1/2002 | Juso et al. |
| 2002/0008309 A1 | 1/2002 | Akiyama |
| 2002/0024124 A1 | 2/2002 | Hashimoto |
| 2002/0170011 A1 | 11/2002 | Lai et al. |
| 2003/0045029 A1 | 3/2003 | Emoto |
| 2003/0190795 A1 | 10/2003 | Kawakami |
| 2006/0053607 A1 | 3/2006 | Onozawa |
| 2011/0171780 A1 | 7/2011 | Kado |

FOREIGN PATENT DOCUMENTS

| | | |
|---|---|---|
| JP | 4-302164 | 10/1992 |
| JP | 7-86492 | 3/1995 |
| JP | 8-97313 | 4/1996 |
| JP | 08-153819 A | 6/1996 |
| JP | 10-214928 A | 8/1998 |
| JP | 11-204720 | 7/1999 |
| JP | 11-307673 A | 11/1999 |
| JP | 2000-243900 | 9/2000 |
| JP | 2000-299431 | 10/2000 |
| JP | 2000-332193 | 11/2000 |
| JP | 2001-56346 | 2/2001 |
| JP | 2001-68588 A | 3/2001 |
| JP | 2001-94042 | 4/2001 |
| JP | 2002-26236 | 1/2002 |
| WO | WO 99/26285 | 5/1999 |

OTHER PUBLICATIONS

Office Action issued Sep. 11, 2012, in Japanese Patent Application No. 2009-272150.

Office Action issued Dec. 25, 2012, in Japanese Patent Application No. 2010-209015.

FIG. 13
FIG. 14
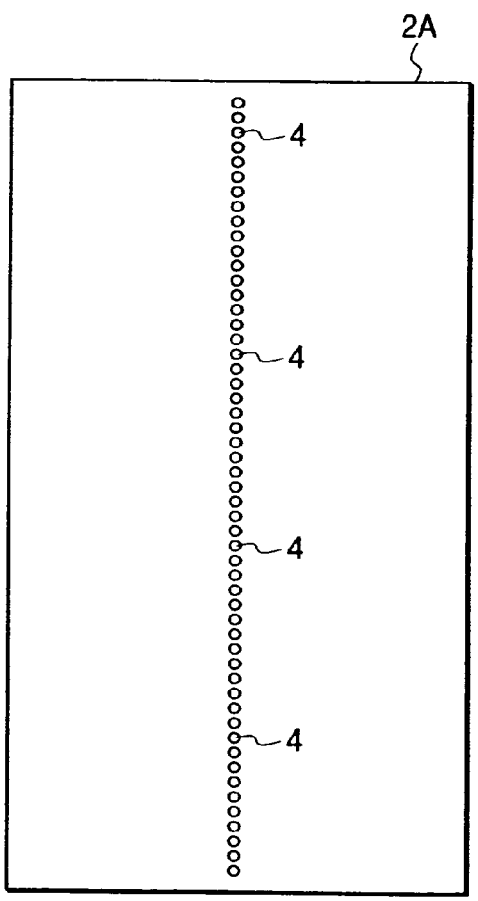
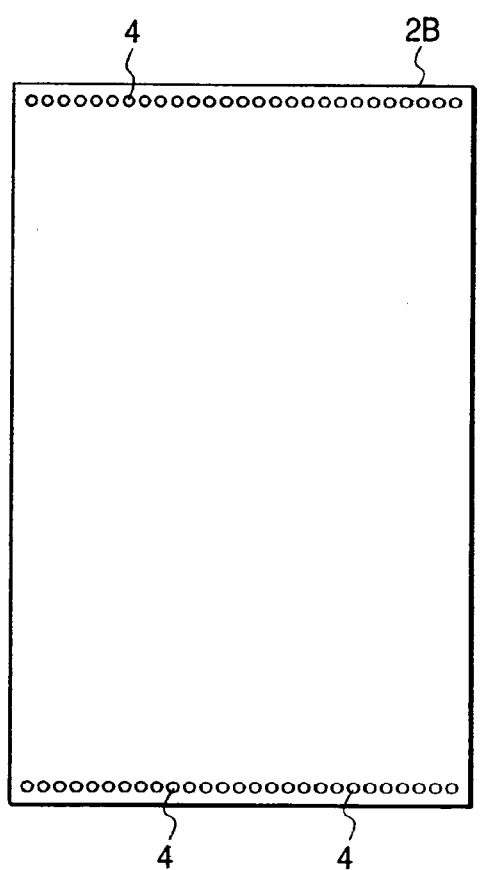

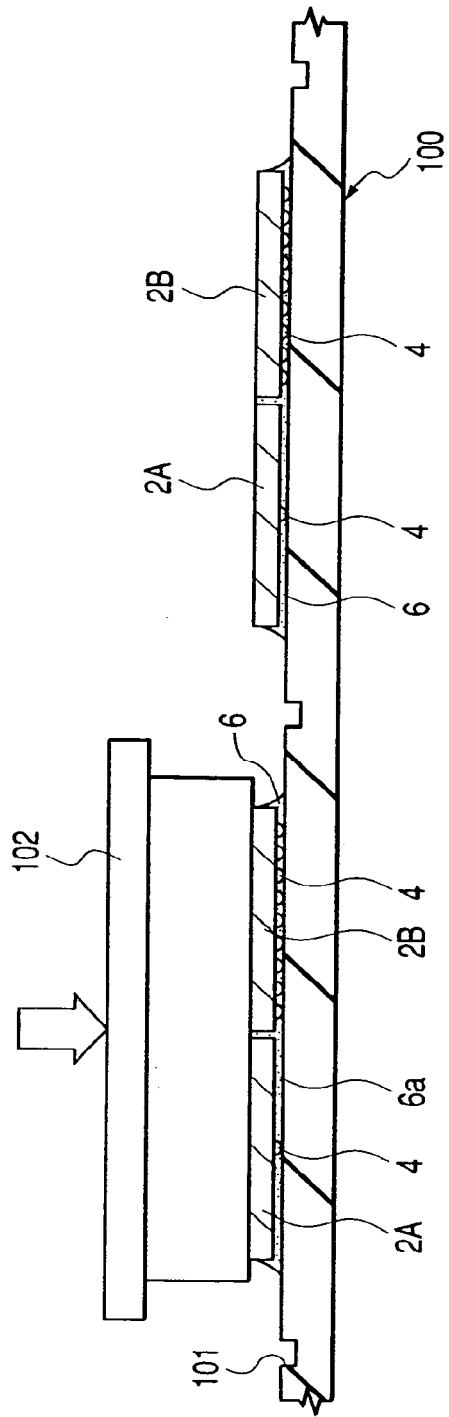
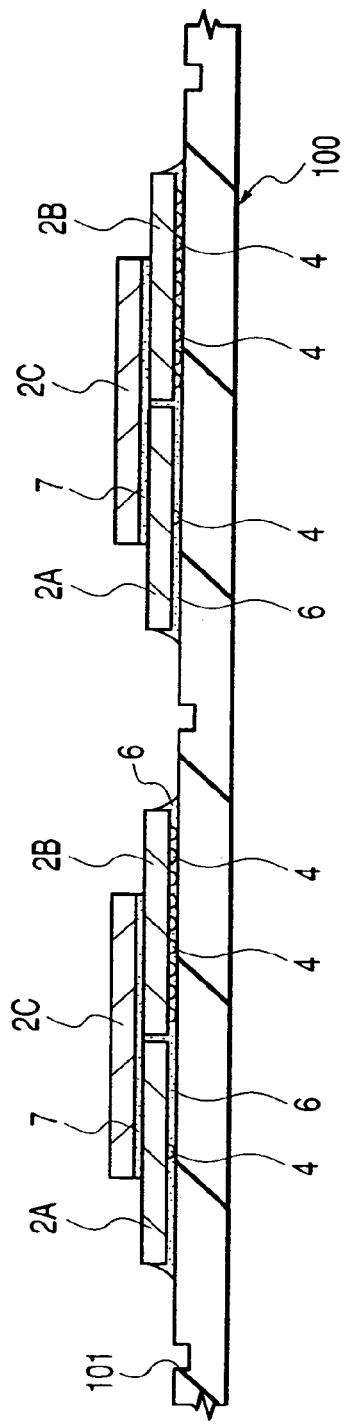

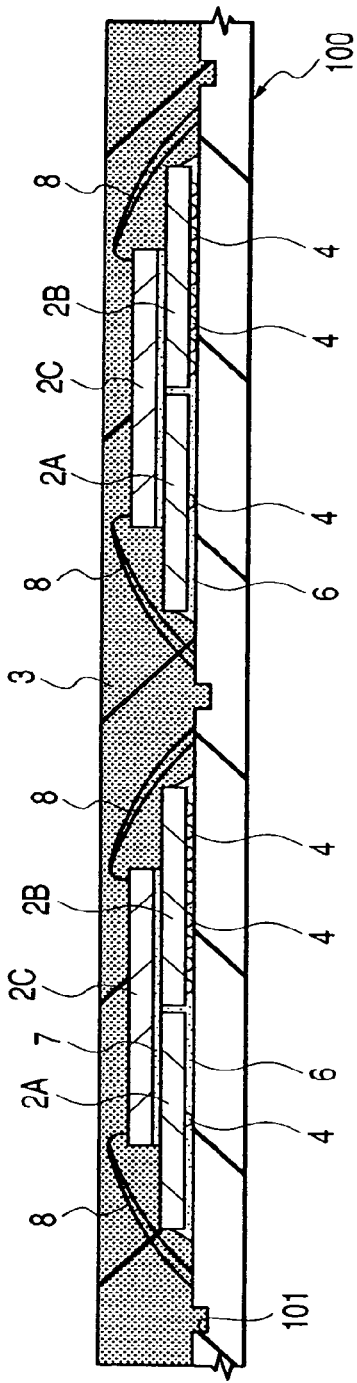
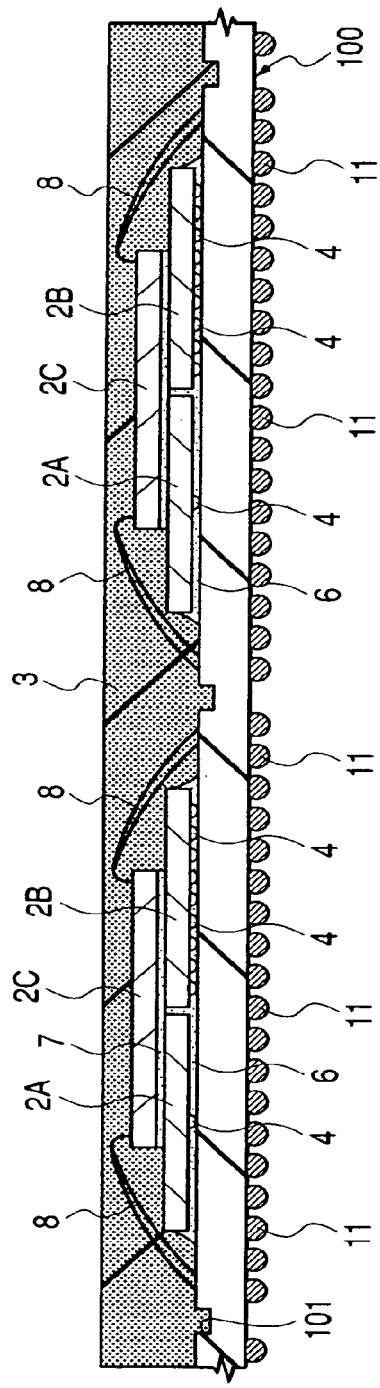

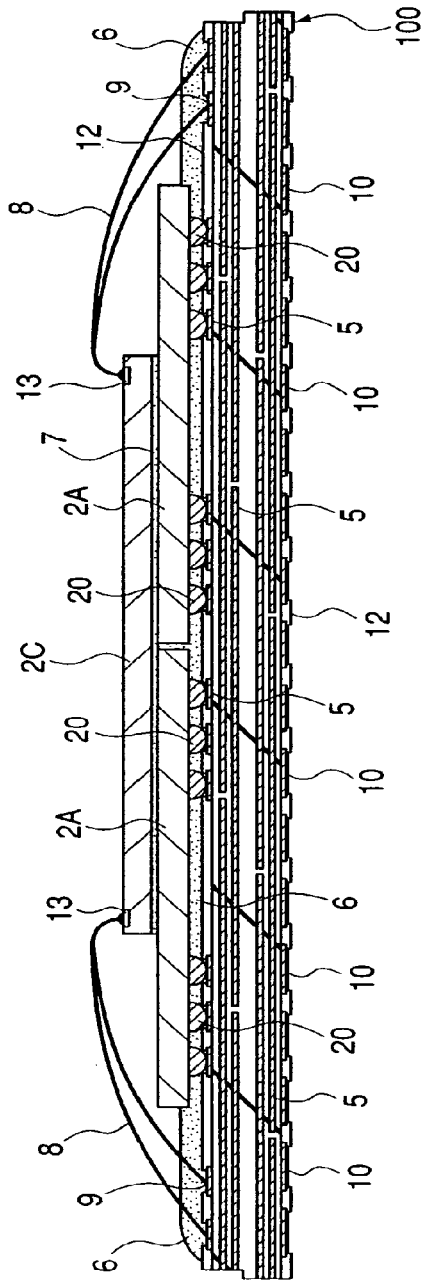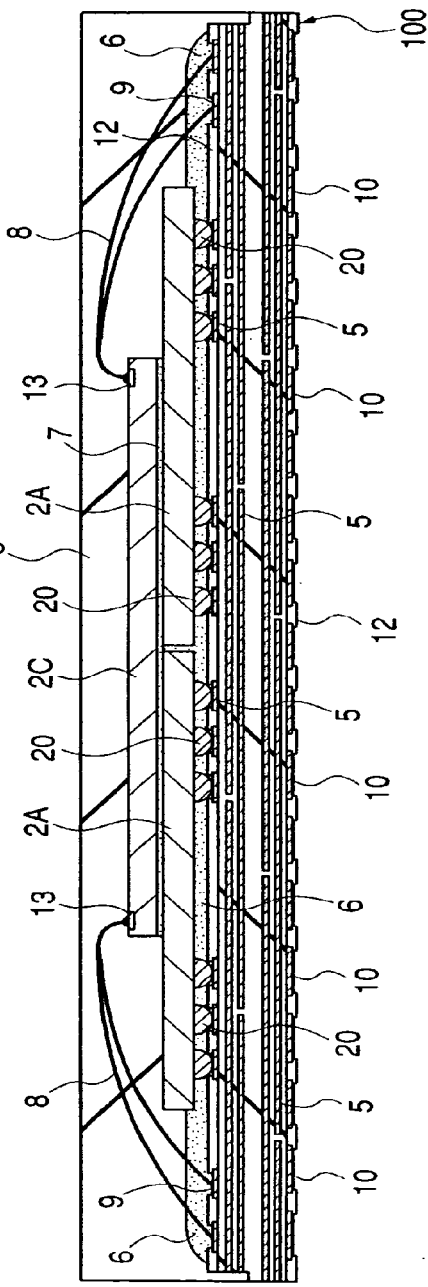

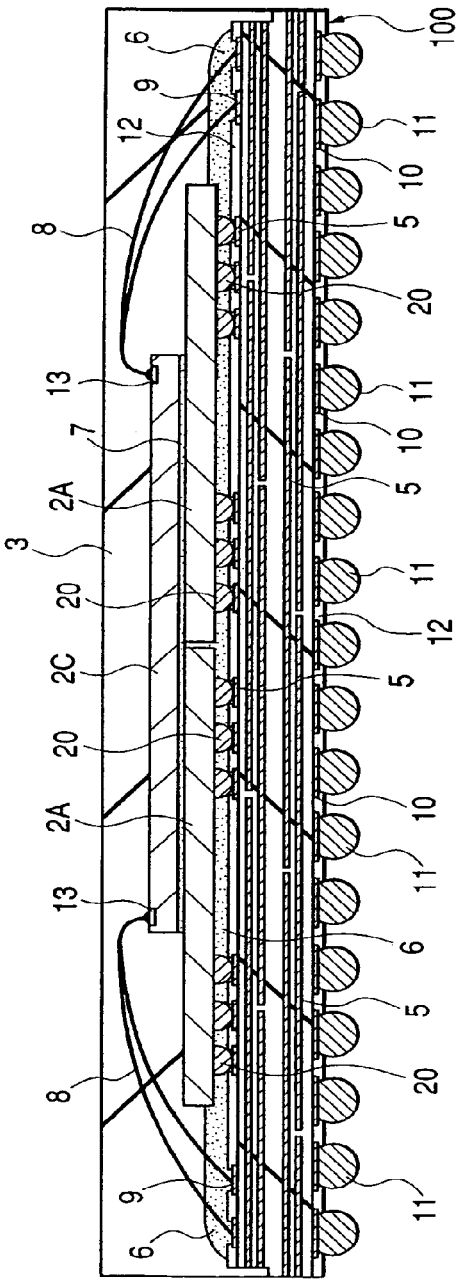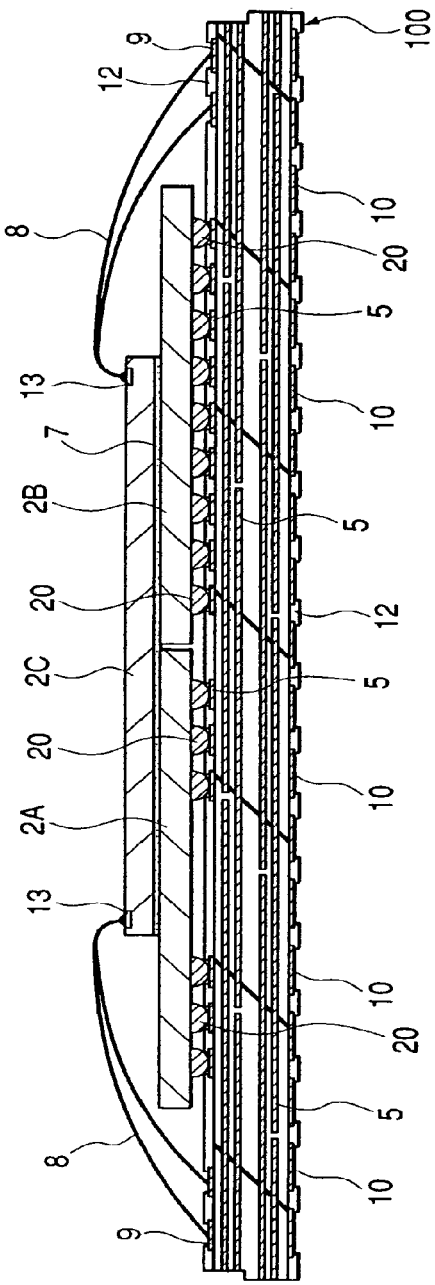

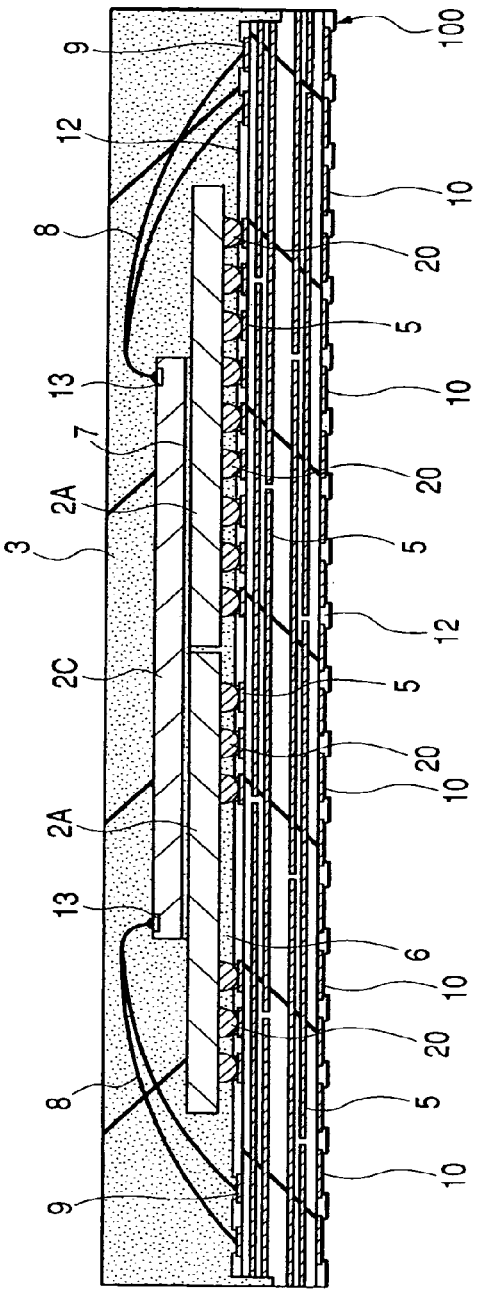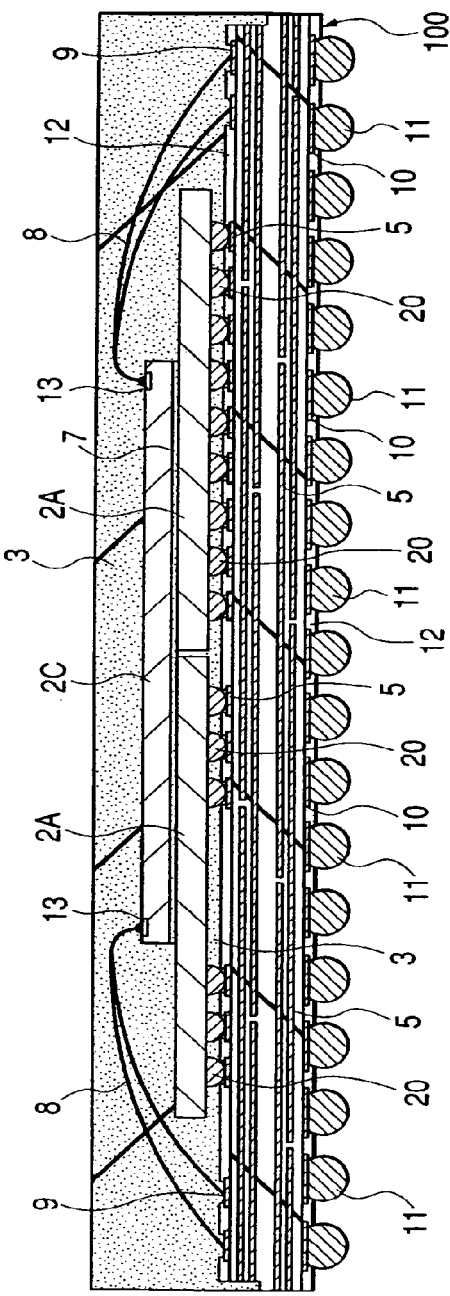

FIG. 45
(a)
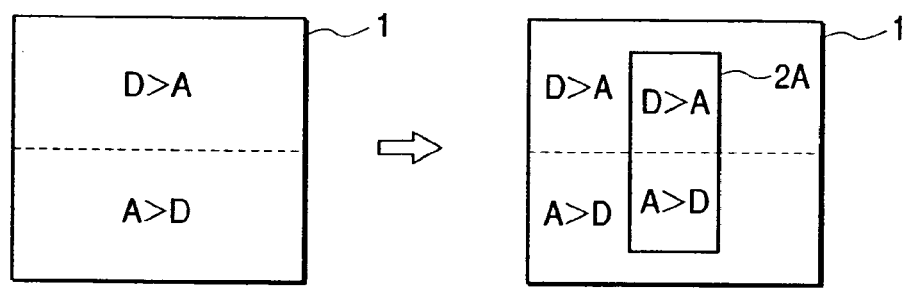
(b)
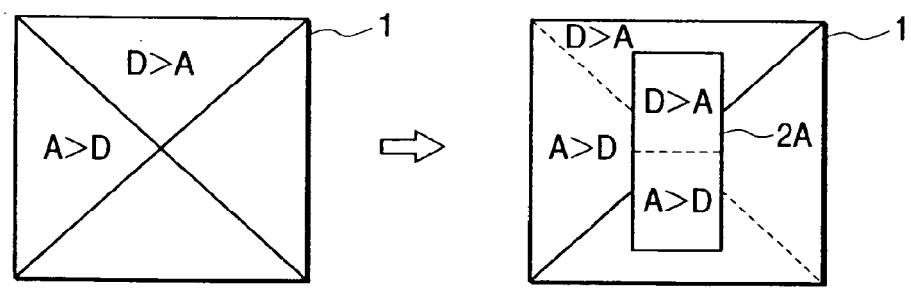
(c)
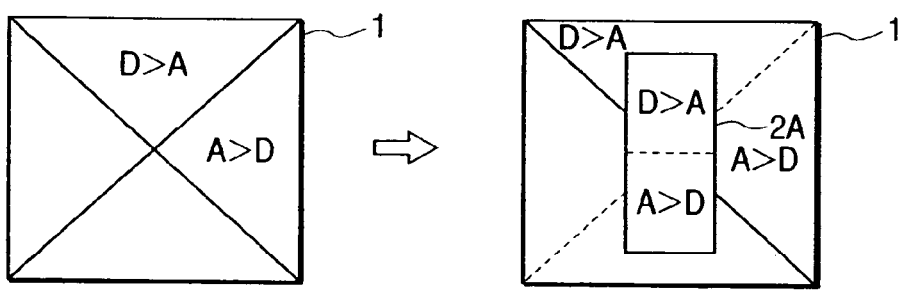

SEMICONDUCTOR DEVICE AND MANUFACTURING METHOD THEREOF

TECHNICAL FIELD

The present invention relates to a semiconductor device and a method of manufacturing the same. Particularly, the present invention is concerned with a technique applicable effectively to a multi-chip module (MCM) or a multi-chip package (MCP) wherein plural semiconductor chips are mounted on one and same wiring substrate.

BACKGROUND ART

As a measure for increasing the capacity of such memory LSIs as flash memory and DRAM (Dynamic Random Access Memory) there have been proposed various memory module structures wherein semiconductor chips (memory chips) with such memory LSIs stacked thereon are sealed in a single package.

For example, Japanese Unexamined Patent Publication No. Hei 4 (1992)-302164 discloses a package structure wherein plural semiconductor chips having the same function and the same size are stacked in the shape of stairs through insulating layers, and bonding pads exposed to the stair portion of each semiconductor chip are electrically connected to inner leads of a package through wires.

In Japanese Unexamined Patent Publication No. Hei 11 (1999)-204720 there is disclosed a package structure wherein a first semiconductor chip is mounted on an insulating substrate through a thermocompression-bonded sheet, a second semiconductor chip smaller in external size than the first semiconductor chip is mounted on the first semiconductor chip through a thermocompression-bonded sheet, bonding pads on the first and second semiconductor chips and a wiring layer on the insulating substrate are electrically connected with each other through wires, and the first and second semiconductor chips and the wires are sealed with resin.

DISCLOSURE OF THE INVENTION

The inventors in the present case are developing a multi-chip module wherein plural semiconductor chips (hereinafter referred to simply as "chips") are mounted within a single package.

According to the multi-chip module under development by the present inventors, a chip having a DRAM (Dynamic Random Access Memory), a chip having a flash memory, and a chip having a high-speed microprocessor (MPU: ultra-small sized processor), are sealed within a single resin package, with the intention of realizing a more versatile system than a conventional memory module having plural memory chips sealed with resin.

In the multi-chip module in question, in order to diminish the mounting area, out of the three chips, the chip having a DRAM and the chip having a flash memory are arranged side by side on a main surface of a package substrate and are packaged in accordance with a flip-chip method, while the third chip having a microprocessor is stacked on the above two memory chips and is packaged in accordance with a wire bonding method.

In the multi-chip module of the above structure, however, when viewed from the standpoint of high-density packaging, the spacing between the two memory chips arranged side by side is several μm or so and is thus very narrow; besides, the third chip is stacked on those two memory chips, so if an attempt is made to seal these memory chips with a molding resin, there arises the problem that the molding resin is difficult to enter the gap between the two memory chips.

Generally, a silica filler is mixed into the molding resin in order to let the thermal expansion coefficient of the molding resin approximate that of a silicon chip. However, the particle diameter (e.g., 70 to 100 μm) of the silica filler is larger than the spacing (several ten μm) between the two memory chips referred to above, so this is one reason why the molding resin is difficult to be injected into the chip-to-chip gap.

If the gap between the two memory chips is not filled with the molding resin, an air pocket (void) is formed therein. Since thermal expansion of the air present in the void is repeated, the molding resin and the chips are peeled off from each other to a greater extent with the void as the center. As a result, for example when an MCP is mounted on a mounting substrate with use of a solder reflow technique, there is a fear that a package crack may occur.

It is an object of the present invention to provide a technique for improving the reliability and attaining high-density packaging and low cost of a multi-chip module wherein plural chips are mounted on a wiring substrate and a main surface thereof is sealed with resin.

It is another object of the present invention to provide a technique for improving the reliability of a multi-chip module wherein on plural chips there is stacked another chip and these chips are sealed with resin.

It is a further object of the present invention to provide a technique capable of reducing the manufacturing cost of a multi-chip module wherein on plural chips there is stacked another chip and these chips are sealed with resin.

The above and other objects and novel features of the present invention will become apparent from the following description and the accompanying drawings.

Typical modes of the invention disclosed herein will be described below briefly.

A multi-chip module according to the present invention comprises a wiring substrate with plural wiring lines and plural electrode pads formed on a main surface thereof, a first semiconductor chip mounted in a first area of the main surface of the wiring substrate and connected electrically to the wiring lines through a plurality of first bump electrodes, a second semiconductor chip mounted in a second area of the main surface of the wiring substrate and connected electrically to the wiring lines through a plurality of second bump electrodes, a third semiconductor chip stacked on the first and second semiconductor chips and connected electrically to the electrode pads through a plurality of bonding wires, a first sealing resin injected into a gap between the first, second semiconductor chips and the wiring substrate and also injected into a gap formed between the first and second semiconductor chips, and a second sealing resin which hermetically seals the first, second and third semiconductor chips.

A multi-tip module manufacturing method according to the present invention comprises the following steps:
(a) providing a paper strip-like substrate (designated a multi-wiring substrate or a multi-substrate) having a main surface partitioned to plural wiring substrate-forming areas and also having plural wiring lines and plural electrode pads formed in each of the plural wiring substrate-forming, areas, a first semiconductor chip having a main surface with plural first bump electrodes formed thereon, a second semiconductor chip having a main surface with plural second bump electrodes formed thereon, and a third semiconductor chip;
(b) disposing the first semiconductor chip in a first area of each of the plural wiring substrate-forming areas in such a manner that the main surface thereof is opposed to the main surface of the multi-wiring substrate, and disposing the second semiconductor chip in a second area of the plural wiring substrate-forming areas in such a manner that the main surface thereof is opposed to the main surface of the multi-chip wiring substrate, thereby electrically connecting the first semiconductor chip and the wiring lines of the multi-wiring substrate with each other through the plural first bump electrodes, and electrically connecting the second semiconductor chip and the wiring lines of the multi-wiring substrate with each other through the plural second bump electrodes;

(c) injecting a first sealing resin into a gap between the first, second semiconductor chips and the multi-wiring substrate and also into a gap formed between the first and second semiconductor chips;

(d) stacking the third semiconductor chip on the first and second semiconductor chips in such a manner that a back side thereof is opposed to the first and second semiconductor chips and thereafter electrically connecting the third semiconductor chip and the electrode pads of the multi-wiring substrate with each other through a plurality of bonding wires;

(e) hermetically sealing, with a second sealing resin, the first, second and third semiconductor chips mounted on the main surface of the multi-wiring substrate; and (f) dicing the multi-wiring substrate along boundary portions of the plural wiring substrate-forming areas to afford wiring substrates each having the first, second and third semiconductor chips mounted on the main surface thereof.

BRIEF DESCRIPTION OF THE DRAWINGS

FIG. 13 is a plan view of a semiconductor chip used in manufacturing the semiconductor device of the first embodiment;

FIG. 14 is a plan view of a semiconductor chip used in manufacturing the semiconductor device of the first embodiment;

FIG. 15 is an enlarged sectional view of a principal portion of the multi-wiring substrate, showing the manufacturing method for the semiconductor device of the first embodiment;

FIG. 16 is an enlarged sectional view of a principal portion of the multi-wiring substrate, showing the manufacturing method for the semiconductor device of the first embodiment;

FIG. 24 is an enlarged sectional view of a principal portion of the multi-wiring substrate, showing the manufacturing method for the semiconductor device of the first embodiment;

FIG. 25 is an enlarged sectional view of a principal portion of the multi-wiring substrate, showing the manufacturing method for the semiconductor device of the first embodiment;

FIG. 32 is an enlarged sectional view of a principal portion of the multi-wiring substrate, showing the manufacturing method for the semiconductor device of the second embodiment;

FIG. 33 is an enlarged sectional view of a principal portion of the multi-wiring substrate, showing the manufacturing method for the semiconductor device of the second embodiment;

FIG. 34 is an enlarged sectional view of a principal portion of the multi-wiring substrate, showing the manufacturing method for the semiconductor device of the second embodi- FIG. 35 is an enlarged sectional view of a principal portion of a multi-wiring substrate, showing a method of manufacturing a semiconductor device according to a third embodiment of the present invention;

FIG. 36 is an enlarged sectional view of a principal portion of the multi-wiring substrate, showing the manufacturing method for the semiconductor device of the third embodiment;

FIG. 37 is an enlarged sectional view of a principal portion of the multi-wiring substrate, showing the manufacturing method for the semiconductor device of the third embodiment;

FIGS. 45(a) to (c) are schematic plan views showing optimal memory chip mounting directions in the semiconductor device of the fourth embodiment.

BEST MODE FOR CARRYING OUT THE INVENTION

Figure 1:
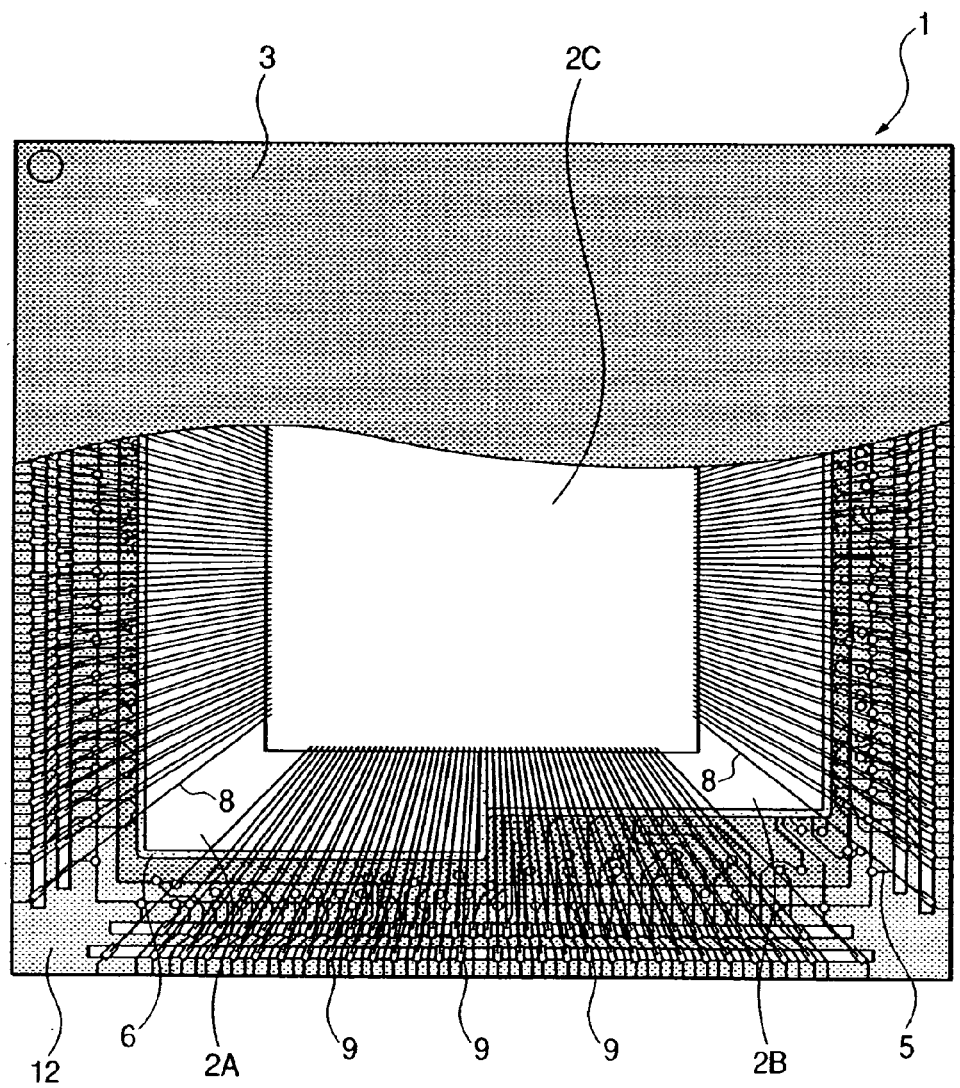
FIG. 1 is a plan view of a semiconductor device according to a first embodiment of the present invention.

Embodiments of the present invention will be described in detail hereinunder with reference to the accompanying drawings. In all of the drawings for illustration of the embodiments, portions having the same functions are identified by like reference numerals, and repeated explanations thereof will be omitted.

First Embodiment

Figure 3:
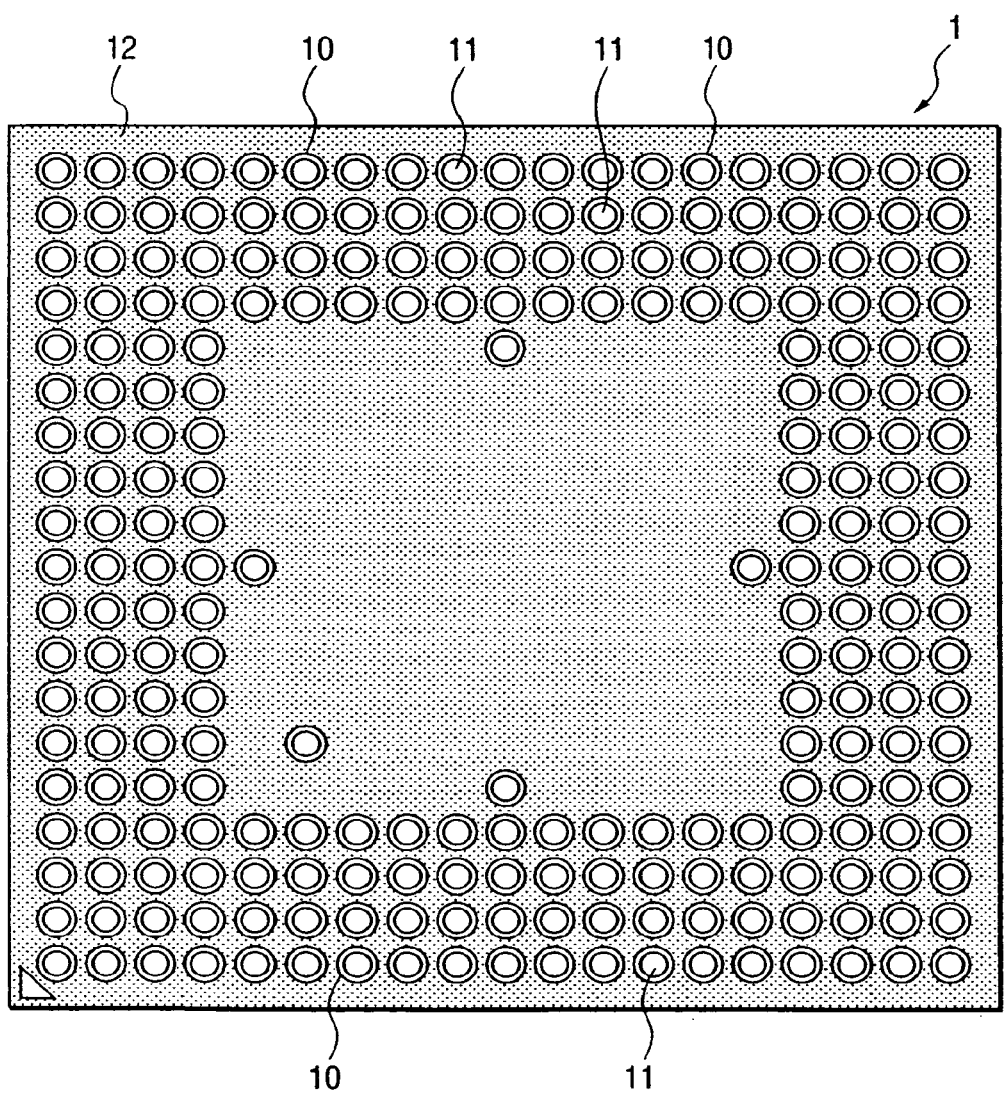
FIG. 3 is a plan view of the semiconductor device of the first embodiment.

FIG. 1 is a plan view showing an upper surface of a semiconductor device according to a first embodiment of the present invention, FIG. 1 is a sectional view of the semiconductor device, and FIG. 3 is a plan view showing a lower surface of the semiconductor device.

The semiconductor device of this embodiment is a multi-chip module (MCM) wherein three chips 2A, 2B and 2C are mounted on a main surface of a package substrate 1 and are sealed with a molding resin 3. Of the three chips 2A to 2C, two chips 2A and 2B are arranged side by side on the main surface of package substrate 1 and are electrically connected to wiring lines 5 on the package substrate 1 through plural Au bumps 4 formed on main surfaces of the chips 2A, 2B. That is, the chips 2A and 2B are each mounted in accordance with a flip-chip method.

A gap is formed between the main surfaces (lower surfaces) of the chips 2A, 2B and the main surface of the package substrate 1, and an under-fill resin (sealing resin) 6 is injected into the said gap. The chip 2A is, for example, a silicon chip on which is formed a DRAM including a memory circuit having plural memory elements. The chip 2B is, for example, a silicon chip with a flash memory formed thereon.

The chip 2C is disposed so as to straddle the two chips 2A and 2B and is bonded to upper surfaces of the chips 2A and 2B with an adhesive 7. Bonding pads 13 formed on a main surface of the chip 2C are electrically connected to bonding pads 9 on the package substrate 1 through plural Au wires 8. That is, the chip 2C is mounted in accordance with a wire bonding method. The chip 2C is, for example, a silicon chip formed with a high-speed microprocessor (MPU: ultra-small sized processor) including a processor circuit which operates in accordance with programs.

The package substrate 1 on which the three chips 2A, 2B and 2C are mounted is a multi-layer wiring substrate constituted mainly by a general-purpose resin such as an epoxy resin (glass fabric-based epoxy resin) which contains glass fiber. Four to six layers of wiring lines 5 are formed on its main surface (upper surface), lower surface, and also in the interior thereof.

On the lower surface of the package substrate 1 are arranged plural electrode pads 10 in an array form, the electrode pads 10 being electrically connected to the wiring lines 5. Solder bumps 11 which constitute external connecting terminals of the multi-chip module (MCM) are connected to the electrode pads 10 respectively. The multi-chip module (MCM) is mounted for example on a wiring substrate of an electronic device through the solder bumps 11. The main surface and the lower surface of the package substrate 1 are coated with a solder resist (insulating film) 12 such as an epoxy resin or an acrylic resin, exclusive of the surfaces of connections between the wiring lines 5 and the chips 2A, 2B, bonding pads 9 and electrode pads 10.

A dimensional example of the multi-chip module (MCM) will now be described. External dimensions of the package substrate 1 are 13 mm long by 13 mm wide and 0.3 mm thick. The thickness of each of the chips 2A, 2B, and 2C mounted on the package substrate 1 is 0.15 mm. The spacing between two chips 2A and 2B which are arranged side by side is 20 to 100 μm. The thickness of the molding resin 3 which seals the chips 2A, 2B, and 2C is 0.66 mm, and the distance from an upper surface of the molding resin 3 to a lower end of each solder bump 11, i.e., the mounting height of the multi-chip module (MCM) is 1.468 mm.

Next, a method of manufacturing the semiconductor device of this embodiment constructed as above will be described below step by step with reference to FIGS. 4 to 26.

Figure 4:
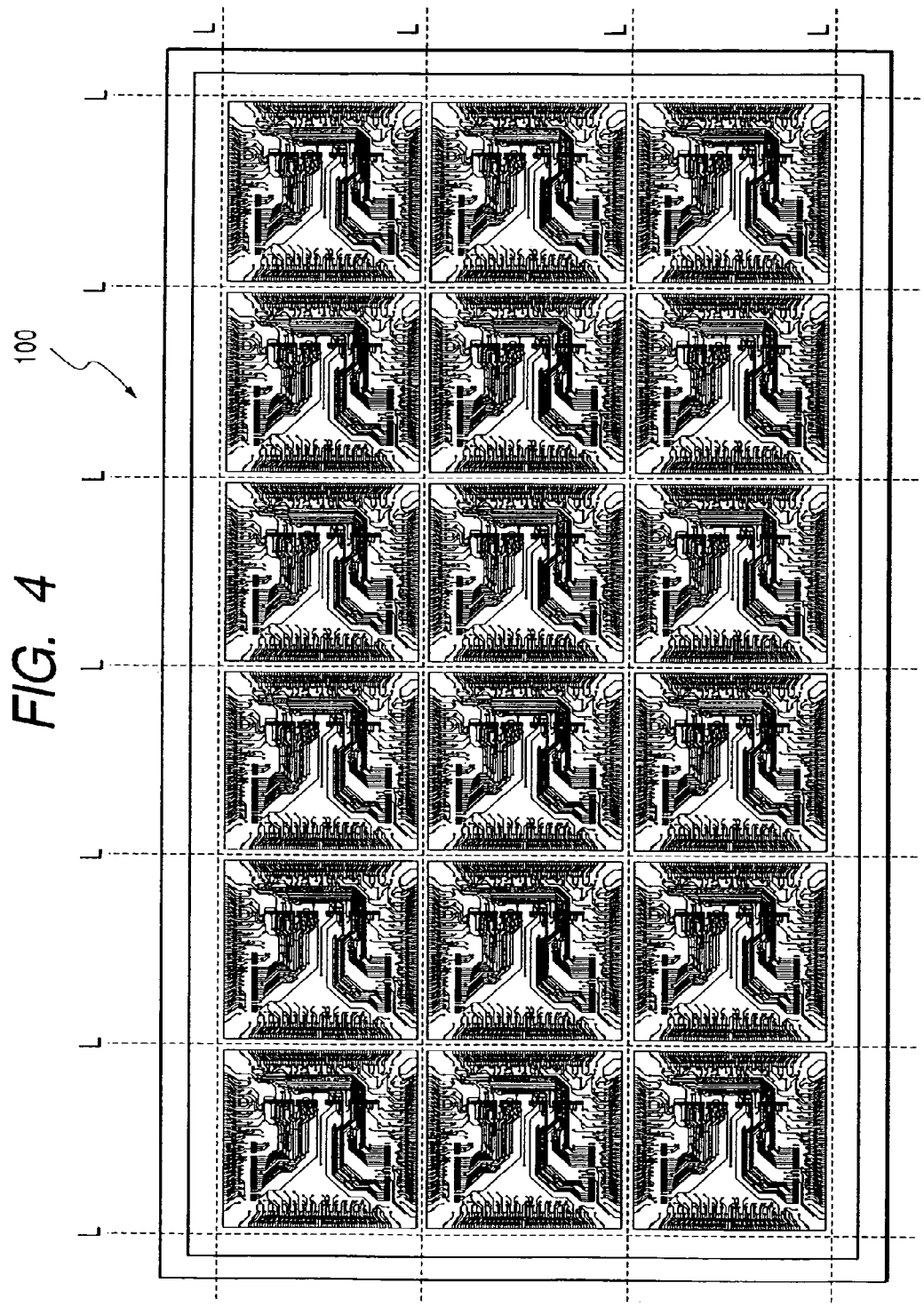
FIG. 4 is a plan view of a multi-wiring substrate used in manufacturing the semiconductor device of the first embodiment.
Figure 5:
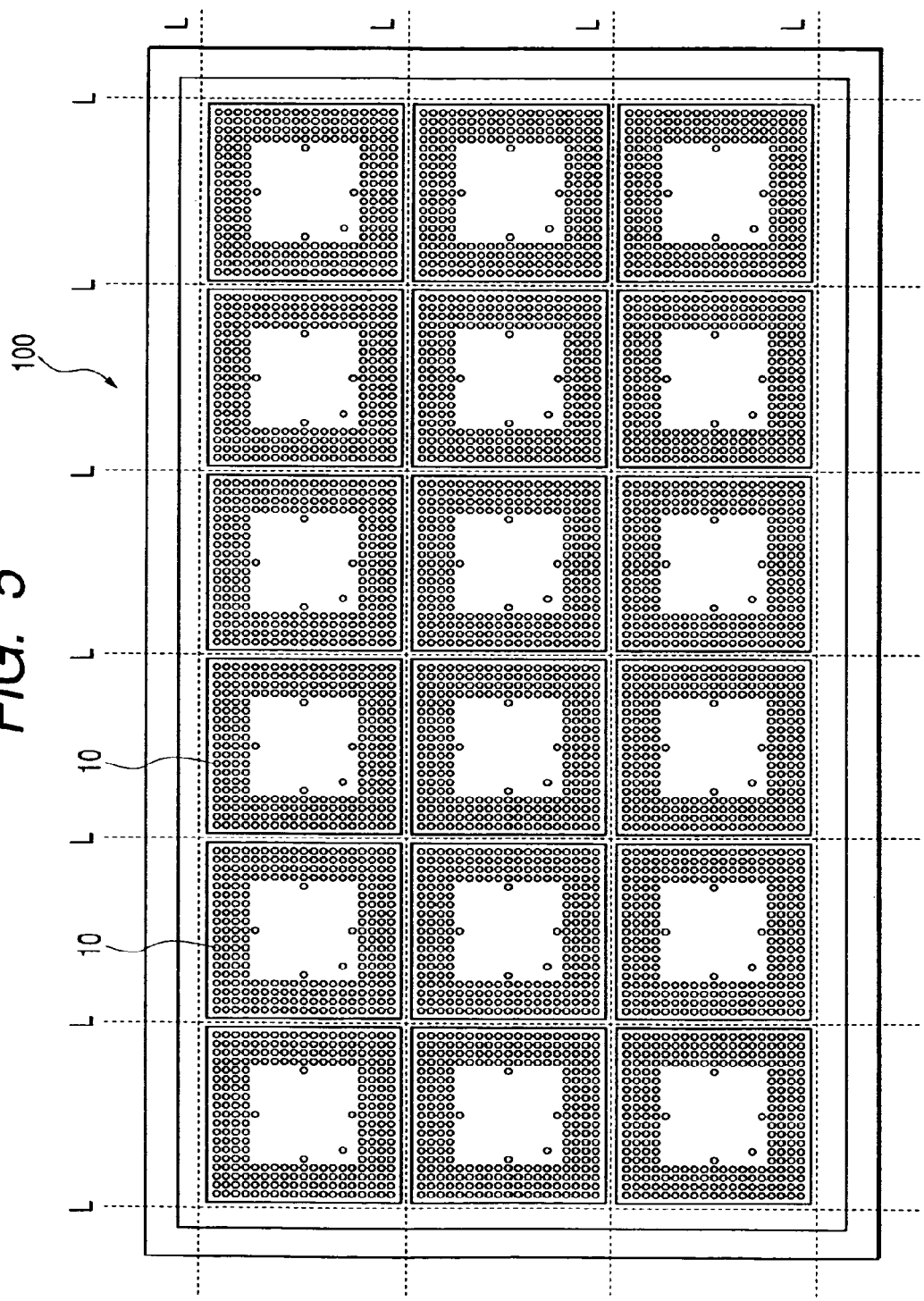
FIG. 5 is a plan view of the multi-wiring substrate used in manufacturing the semiconductor device of the first embodiment.
Figure 6:
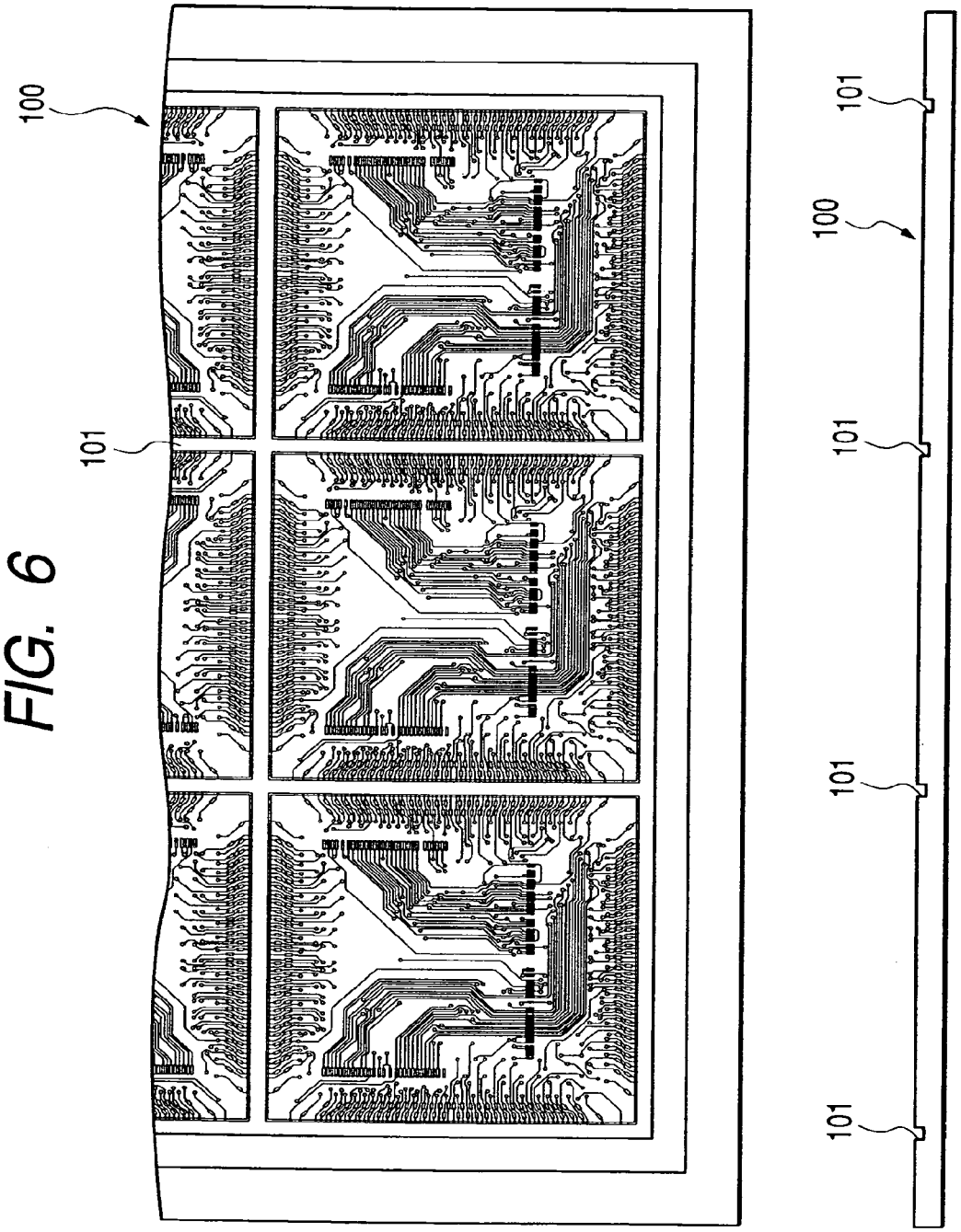
FIG. 6 is an enlarged plan view of a principal portion of the multi-wiring substrate shown in FIG. 5.
Figure 7:
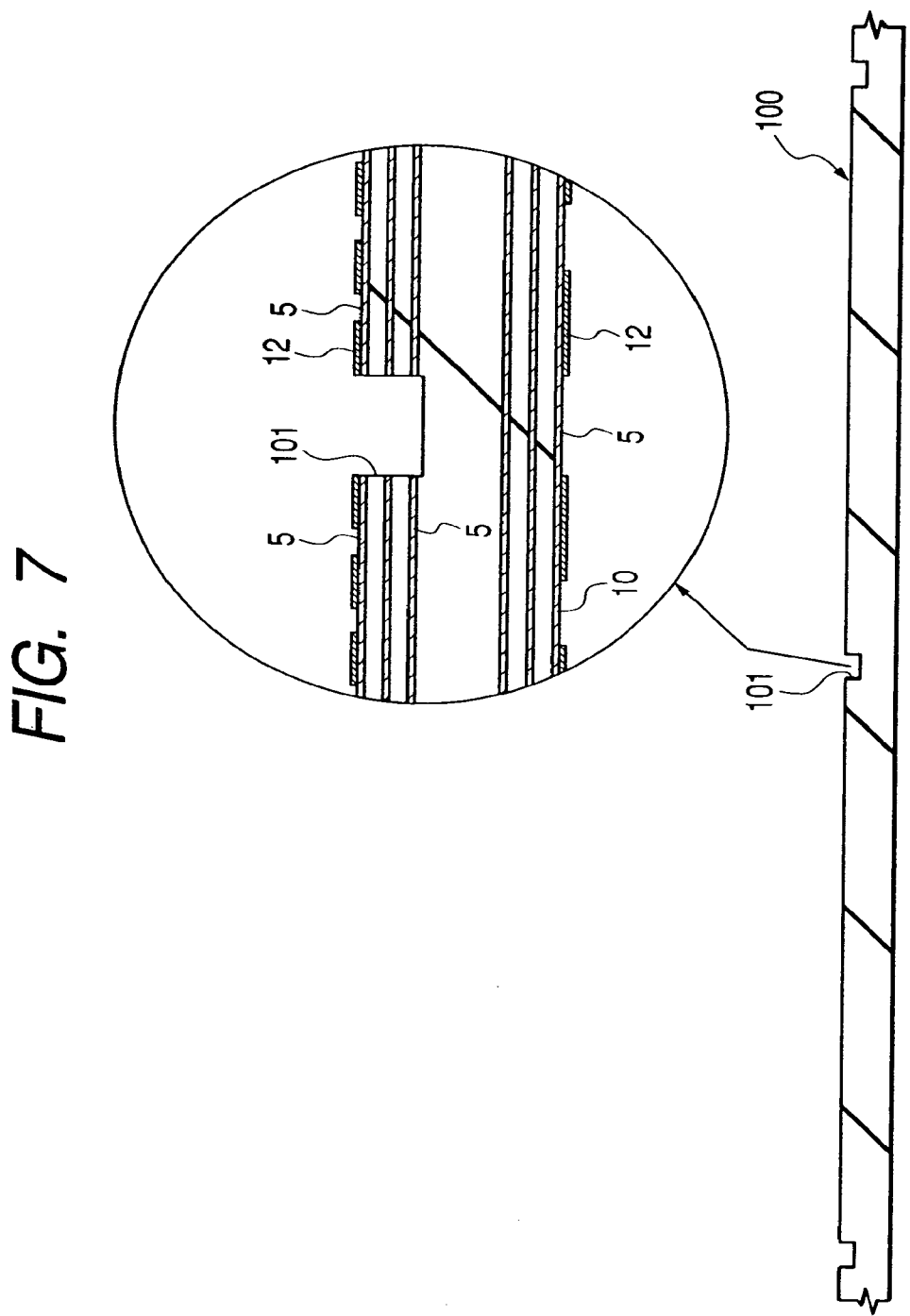
FIG. 7 is an enlarged sectional view of a principal portion of the multi-wiring substrate shown in FIG. 5.
Figure 8:
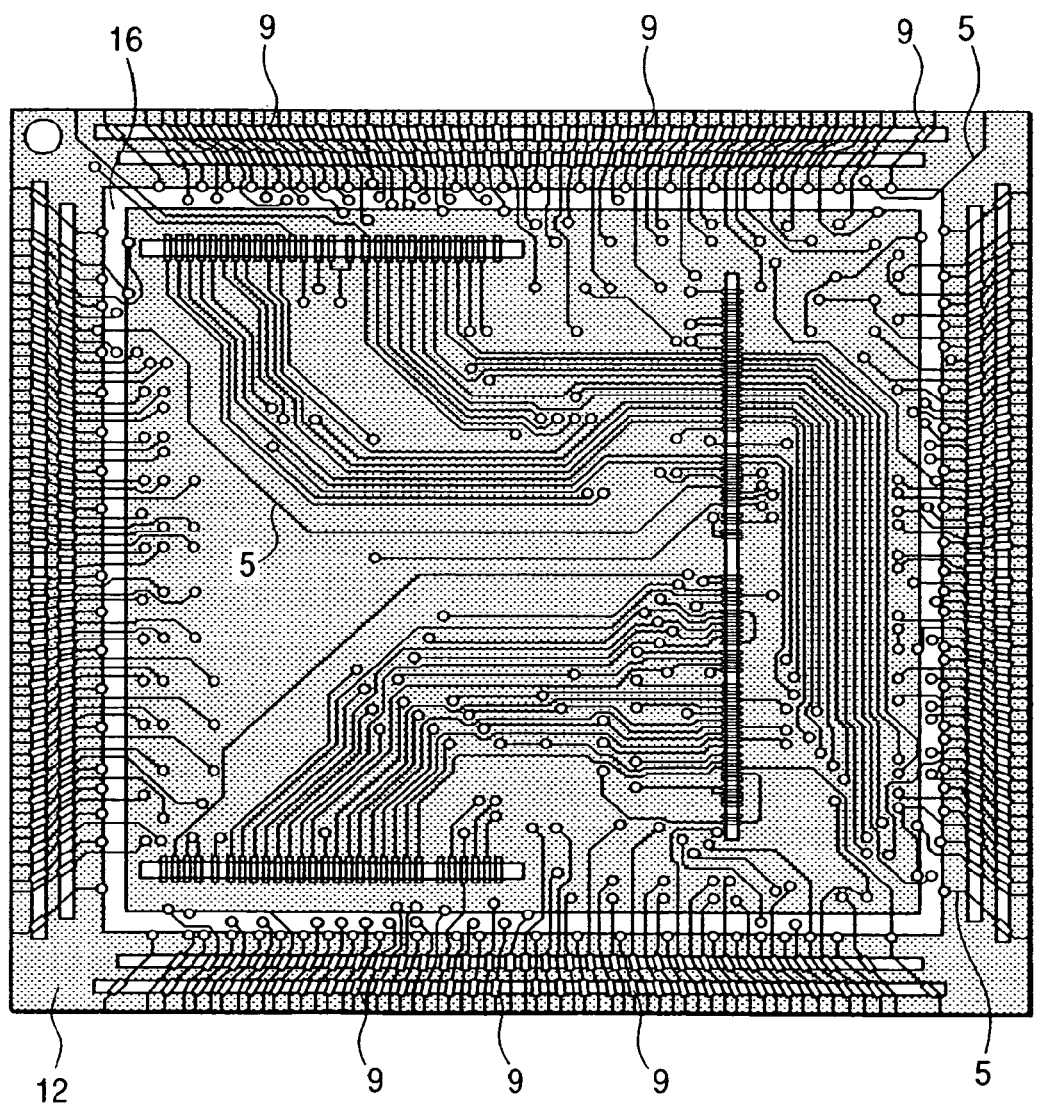
FIG. 8 is an enlarged plan view of a principal portion of the multi-wiring substrate shown in FIG. 5.

FIGS. 4 to 8 illustrate a rectangular substrate (hereinafter referred to as "multi-wiring substrate 100") used in manufacturing the multi-chip module (MCM), of which FIG. 4 is an entire plan view showing a main surface (chip mounting surface) of the multi-wiring substrate 100, FIG. 5 is an entire plan view showing a back side of the multi-wiring substrate 100, FIG. 6 comprises a plan view and a side view, showing a part of the multi-wiring substrate 100, FIG. 7 is a sectional view showing a part of the multi-wiring substrate 100, and FIG. 8 is an enlarged plan view showing a part (an area corresponding to one package substrate) of the multi-wiring substrate 100.

The multi-wiring substrate 100 is a substrate serving as a matrix of the package substrate 1 described previously. By dicing the multi-wiring substrate 100 in a lattice shape along dicing lines L shown in FIGS. 4 and 5 into individual pieces there are obtained plural package substrates 1. The illustrated multi-wiring substrate 100 is partitioned in its long side direction into six blocks of package substrate-forming areas and in its short side direction into three blocks of package substrate-forming areas, so that there are obtained 3×6=18 package substrates 1.

The multi-wiring substrate 100 is a multi-layer wiring substrate constituted mainly by a general-purpose resin such as a glass fabric-based epoxy resin. On the main surface of the multi-wiring substrate 100 are formed wiring lines 5 and bonding pads 9, while on a back side thereof are formed electrode pads 10. Further, in the interior of the multi-wiring substrate 100 are formed plural layers of wiring lines 5. By fabricating the package substrate 1 with use of an inexpensive general-purpose resin it is possible to reduce the manufacturing cost of the multi-chip module (MCM).

The wiring lines 5 and the bonding pads 9 on the main surface of the multi-wiring substrate 100, as well as the electrode pads 10 on the back side thereof, are formed by etching Cu foil affixed to both sides of the multi-wiring substrate 100. In the wiring lines 5 formed on the main surface of the multi-wiring substrate 100, the surfaces of regions not covered with solder resist 12, i.e., the surfaces of regions to which Au bumps 4 of chips 2A and 2B are connected, are plated with Ni and Au. The surfaces of the bonding pads 9 and electrode pads 10 are also plated with Ni and Au. These platings can be done by an electroless plating method, but the plating layer formed by the electroless plating method is thin and it is difficult to ensure a sufficient bonding strength when Au wires 8 are connected onto the bonding pads 9. For this reason, the above Ni and Au platings are performed by an electrolytic plating method which can afford a thicker film than in the electroless plating method.

In the case where the surfaces of the wiring lines 5, bonding pads 9 and electrode pads 10 are to be plated with Ni and Au by the electrolytic plating method, the plating is carried out in a state in which the wiring lines 5, bonding pads 9 and electrode pads 10 are conducting in the whole area of the multi-wiring substrate 100, then the wiring lines 5 lying on the dicing lines L are cut with a router, and thereafter each package substrate-forming area is tested for continuity. Therefore, as shown in FIGS. 6 and 7, grooves 101 formed by cutting the wiring lines 5 in the above-mentioned areas with the router are left over along the dicing lines L on the main surface of the multi-wiring substrate 100. Since the wiring lines formed continuously between package substrates for continuity test are cut with the router, the continuity test can be conducted in an individual manner. Besides, since the multi-wiring substrate 100 is not cut off completely, it is possible to facilitate a block molding process and the substrate conveyance which follows. End portions of cut wiring lines are exposed from side faces of the grooves 101.

As shown in FIG. 8, plural bonding pads 9 are formed in the peripheral portion of each package substrate-forming area so as to surround the chip mounting area. The bonding pads 9 are arranged in two rows along the four sides of the package substrate-forming area. Between the bonding pads 9 and the chip mounting area is formed a dam area 16 so as to surround the chip mounting area. The dam area 16 is an area in which the solder resist 12 is not formed, and its surface height is lower than the areas located inside and outside the dam area and in which the solder resist 12 is formed. Thus, when injecting the under-fill resin 6 below the chips 2A and 2B, the dam area 16 functions to prevent the under-fill resin 6 from flowing to the peripheral portion of the package substrate-forming area, i.e., to the area where the bonding pads 9 are formed.

Figure 9:
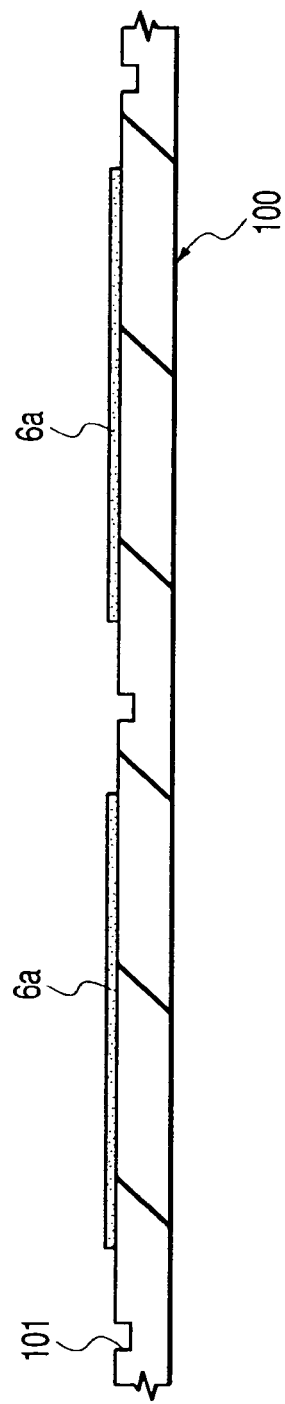
FIG. 9 is an enlarged sectional view of a principal portion of the multi-wiring substrate, showing a method of manufacturing the semiconductor device of the first embodiment.
Figure 10:
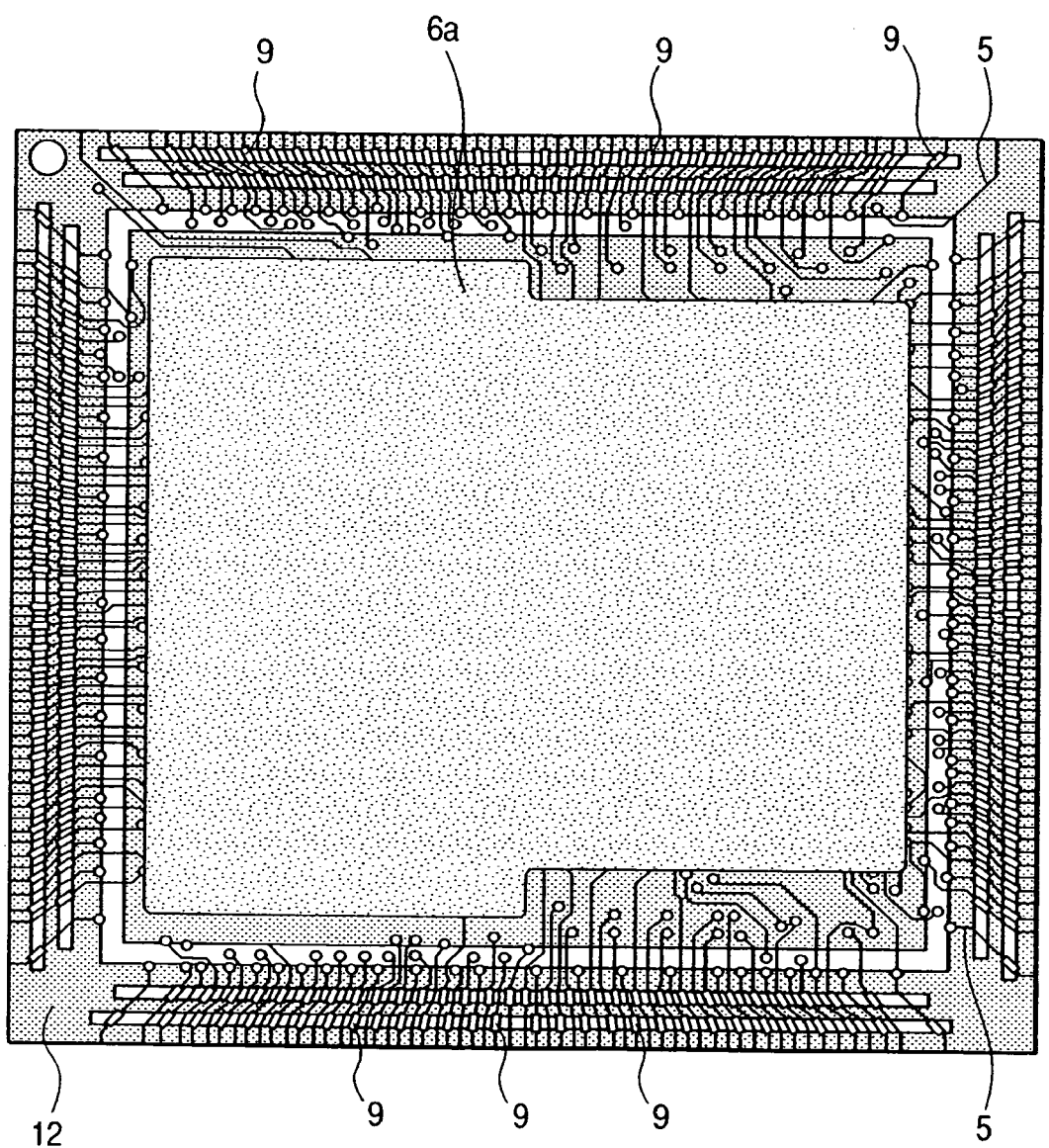
FIG. 10 is an enlarged plan view of a principal portion of the multi-wiring substrate, showing the manufacturing method for the semiconductor device of the first embodiment.

For fabricating the multi-chip module (MCM) with use of the multi-wiring substrate 100, as shown in FIG. 9 (a sectional view showing an area corresponding to two package substrates) and FIG. 10 (an enlarged plan view showing an area corresponding to one package substrate), a resin tape 6a is affixed to the main surface of the multi-wiring substrate 100. For example, the resin tape 6a is formed of a thermosetting epoxy resin with silica dispersed therein, the silica having a particle diameter of about 3 μm. The resin tape 6a is cut beforehand into a size almost equal to two chips (2A, 2B). The resin tape 6a may also be constituted, for example, by an anisotropic conductive resin (ACF) with a fine conductive powder dispersed therein. As the resin tape 6a there may be used two sheets of tapes divided into a size almost equal to the size of each semiconductor chip 2A (2B).

Moisture contained in the atmosphere gets into the multi-wiring substrate 100 which is left standing in the atmosphere, so if the resin tape 6a is affixed to the main surface of the multi-wiring substrate 100 as it is, the adhesion between the two may be deteriorated. Therefore, when the resin tape 6a is to be affixed to the substrate main surface, it is desirable that the multi-wiring substrate 100 be baked just before the affixing to remove moisture. For example, baking conditions involve a temperature of 125° C. and a baking time of 2 hours or so. If the multi-wiring substrate 100 is treated with plasma after the baking process to activate the surface of the substrate, it is possible to further improve the adhesion between the resin tape 6a and the multi-wiring substrate 100.

Figure 11:
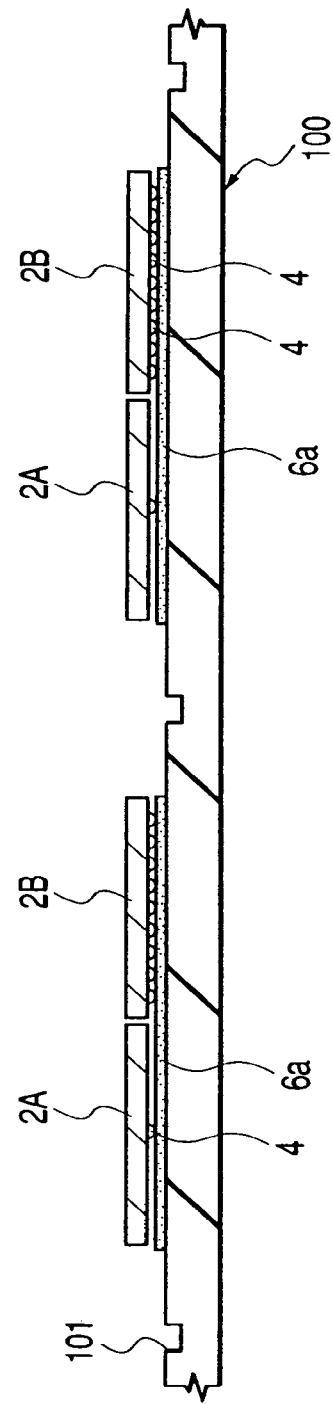
FIG. 11 is an enlarged sectional view of a principal portion of the multi-wiring substrate, showing the manufacturing method for the semiconductor device of the first embodiment.
Figure 12:
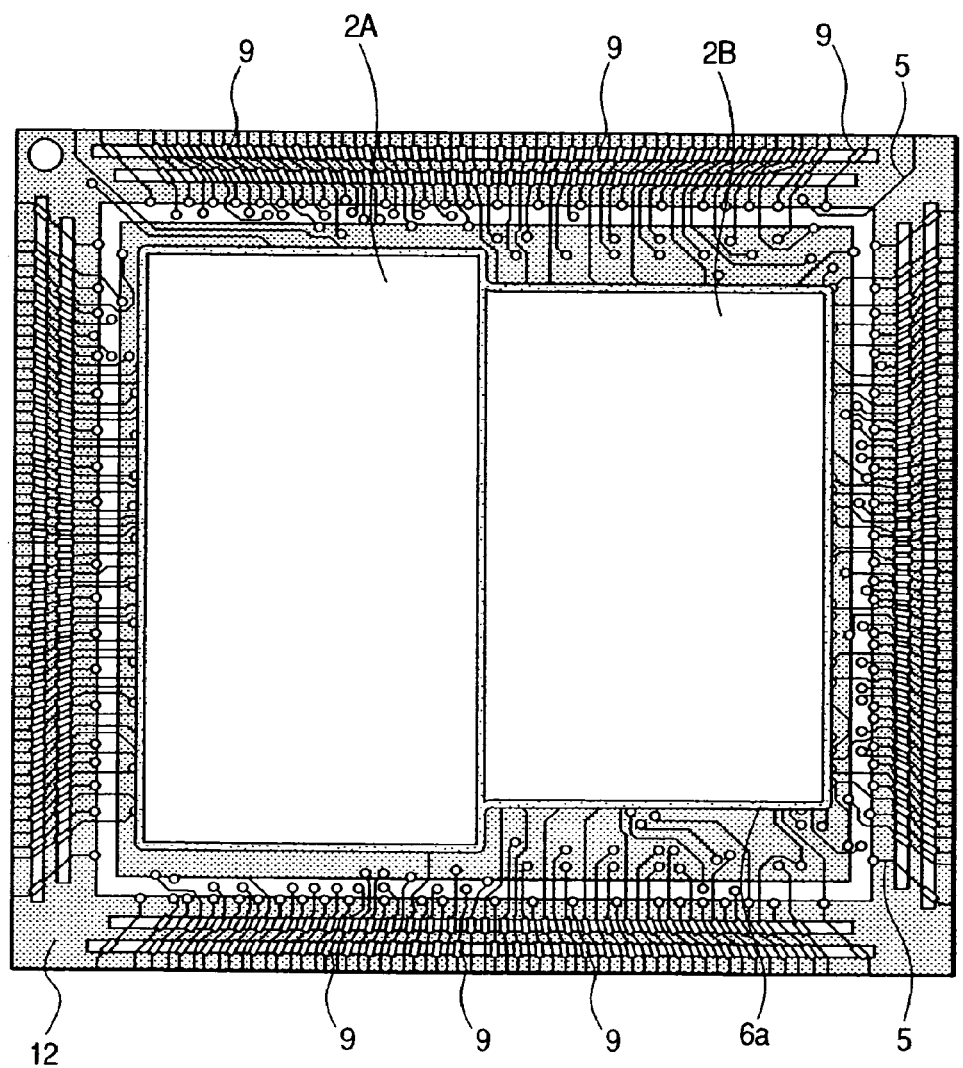
FIG. 12 is an enlarged plan view of a principal portion of the multi-wiring substrate, showing the manufacturing method for the semiconductor device of the first embodiment.

Next, by a face-down bonding method, as shown in FIGS. 11 and 12, two chips 2A and 2B are mounted onto the resin tape 6a affixed to the main surface of the multi-wiring substrate 100. At this time, the gap between the chips 2A and 2B is set at a value of 20 to 100 μm. The particle diameter of silica contained in the resin tape 6a is about 3 μm, so even if the gap between the two chips is made as narrow as 20 μm, it is possible to inject the under-fill resin 6 into the above-mentioned gap. On the other hand, if the gap between the chips 2A and 2B is too wide, the gap is not filled to a complete extent with the under-fill resin 6 and an air pocket (void) may occur in the gap in a later molding process. Further, widening the chip-to-chip gap means enlarging the area of each wiring substrate and thus impedes high-density packaging.

As shown in FIG. 13, in accordance with a ball bonding method, Au bumps 4 are formed beforehand on the main surface of the chip 2A with a DRAM formed thereon. Also on the main surface of the chip 2B with a flash memory formed thereon there are formed Au bumps 4 beforehand in the same manner, as shown in FIG. 14. These Au bumps 4 are formed in the final step of a wafer process. More specifically, after completion of the ordinary wafer process, Au bumps 4 are formed on bonding pads of wafer in accordance with a ball bonding method and thereafter the wafer is diced to obtain individual chips 2A and 2B.

Usually, bonding pads of a DRAM are arranged in one row centrally of a chip, but bonding pads of a flash memory are arranged in two rows along short sides of a chip. Therefore, the bonding pads of the DRAM are narrower in pad pitch than the bonding pads of the flash memory, with consequent reduction also in pad diameter, (for example, in case of the terminal pitch of the flash memory being 150 μm, that of the DRAM is about 85 μm). Usually, therefore, Au wires of a small diameter (e.g., 20 μm dia.) are used when forming Au bumps 4 on the bonding pads of the DRAM, while Au wires of a large diameter (e.g., 30 μm dia.) are used when forming Au bumps 4 on the bonding pads of the flash memory.

In the multi-chip module (MCM) of this embodiment, however, since the third chip 2C is stacked on the two chips 2A and 2B, it is necessary that the mounting height of the chip 2A and that of the chip 2B be made equal by making both chips equal in chip thickness and the diameter of Au bumps 4.

Therefore, in this embodiment, Au wires used in forming Au bumps 4 on the bonding pads of the flash memory are the same in diameter (e.g., 20 µm dia.) as the Au wires used in forming Au bumps 4 on the bonding pads of the DRAM. In this case, when the thickness (e.g., 25 µm) of the solder resist 12 is taken into account, the Au bumps 4 formed by using fine Au wires are reduced in the area of contact thereof with the bonding pads and thus there may occur a state of poor contact. In this embodiment, for ensuring a required area of contact between Au bumps 4 and bonding pads, there is adopted a multi-stage bump structure wherein Au bumps 4 are superimposed and bonded onto Au bumps 4.

Next, as shown in FIG. 15, a heat tool (also called heat block) 102 having a flat bottom is pushed onto the two chips 2A and 2B. For example, the pushing pressure of the heat tool 102 is 15 kg/10 mm$^2$ and the heating temperature is 235° C., whereby not only the resin tape 6a melts and the gap between the chips 2A, 2B and the multi-wiring substrate 100 and the gap between the chips 2A and 2B are filled with the under-fill resin 6, but also the Au bumps 4 on the chips 2A, 2B and the wiring lines (not shown in FIG. 15) on the multi-wiring substrate 100 are connected together electrically. The under-fill resin 6 is formed for protecting the main surfaces (the surfaces on which semiconductor elements and electrodes (bonding pads) are formed) of the chips 2A and 2B, for bonding the chips 2A and 2B to the multi-wiring substrate 100, and for ensuring a required strength of connection between the bump electrodes 4 and the electrode pads on the multi-wiring substrate 100.

Thus, in this embodiment, by melting the resin tape 6a formed almost equal in size to the chips 2A and 2B, the gap between the chips 2A, 2B and the multi-wiring substrate 100 and the gap between the chips 2A and 2B are filled with the under-fill resin 6. According to this method, for example in comparison with a resin filling method wherein a liquid under-fill resin is fed around the chips 2A and 2B with use of a dispenser, it is possible to diminish the amount of the under-fill resin 6 protruded to around the chips 2A and 2B and therefore the bonding pads 9 on the multi-wiring substrate 100, which are arranged so as to surround the chips 2A and 2B, are not covered with the under-fill resin 6.

Figure 17:
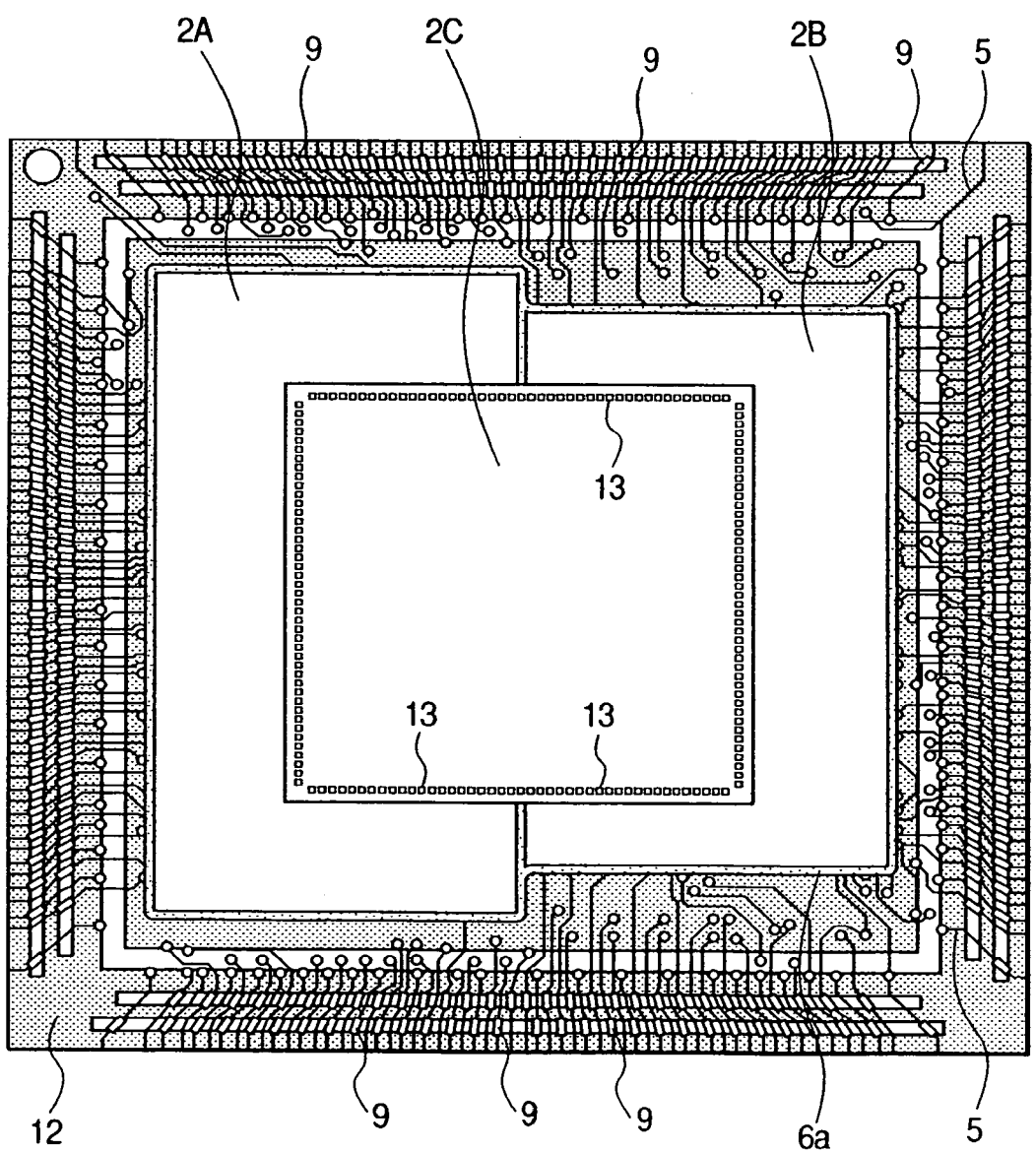
FIG. 17 is an enlarged plan view of a principal portion of the multi-wiring substrate, showing the manufacturing method for the semiconductor device of the first embodiment.
Figure 18:
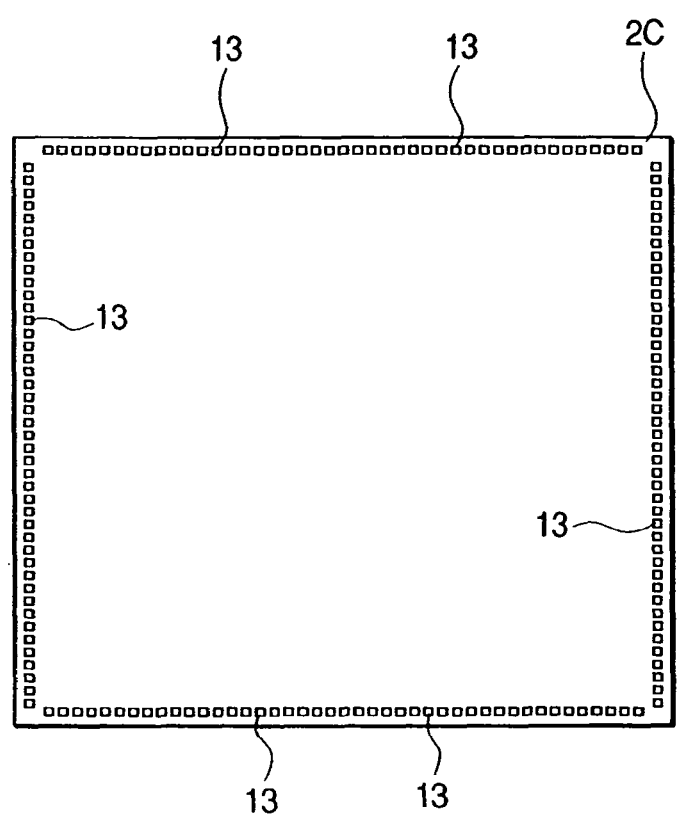
FIG. 18 is a plan view of a semiconductor chip used in manufacturing the semiconductor device of the first embodiment.

Next, as shown in FIGS. 16 and 17, a chip 2C is mounted on the two chips 2A and 2B. As shown in FIG. 18, bonding pads 13 are formed along the four sides of a main surface of the chip 2C on which is formed a microprocessor. The number of the bonding pads 13 is larger than that of the bonding pads formed on the chips 2A and 2B. Thus, the chip with a relatively small number of bonding pads is mounted by a face-down method, while the chip with a relatively large number of bonding pads is mounted by a face-up method, whereby the wiring density (wiring pitch) of the wiring substrate and the distribution of wiring are decreased and it is possible to provide a high-density package of low cost.

Figure 19:
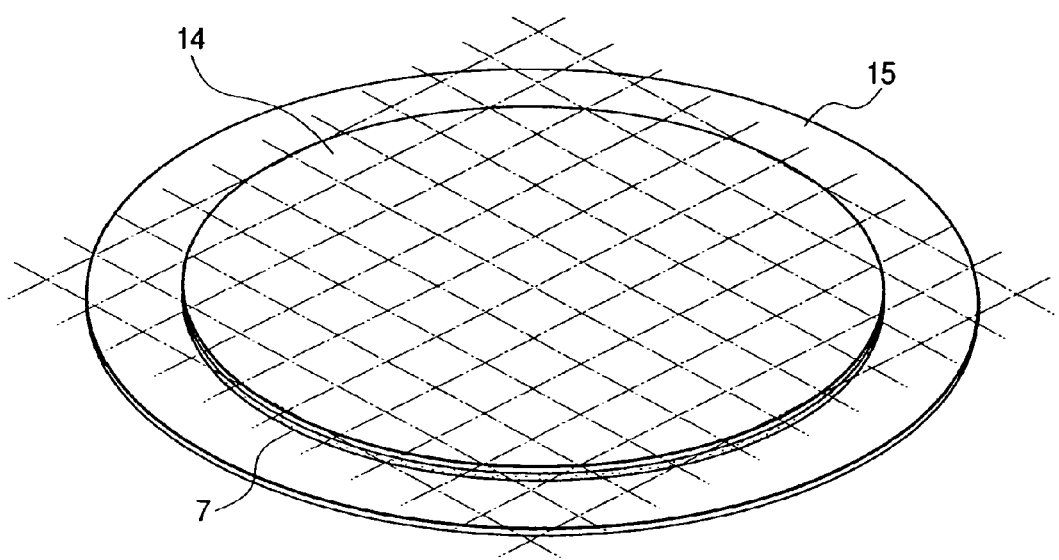
FIG. 19 is a perspective view of a semiconductor wafer, showing the manufacturing method for the semiconductor device of the first embodiment.
Figure 20:
FIG. 20 is a side view of the semiconductor wafer, showing the manufacturing method for the semiconductor device of the first embodiment.

The chip 2C is disposed centrally of each package substrate-forming area so that the Au wires 8 which connect the multi-wiring substrate 100 and the chip 2C become as uniform as possible in length. Further, a tape-like adhesive 7 pre-cut to the same size as the chip 2C is affixed to a back side of the chip 2C in the following manner. As shown in FIGS. 19 and 20, at the time of affixing a dicing tape 15 to a back side of a wafer 14 after completion of the ordinary wafer process, the tape-like adhesive 7 is sandwiched in between the wafer 14 and the dicing tape 15 and in this state the wafer 14 is diced to obtain the chip 2C. Thereafter, the dicing tape 15 is removed from the back side of the chip 2C, whereby the adhesive 7 of the same size as the chip 2C is left unremoved on the back side of the chip 2C. As the adhesive 7 there is used a polyimide resin-based adhesive for example.

Next, the multi-wiring substrate 100 is heated within a heating furnace at 180° C. for 1 hour or so, whereby the adhesive 7 softens and the chip 2C is bonded onto the chips 2A and 2B.

Figure 21:
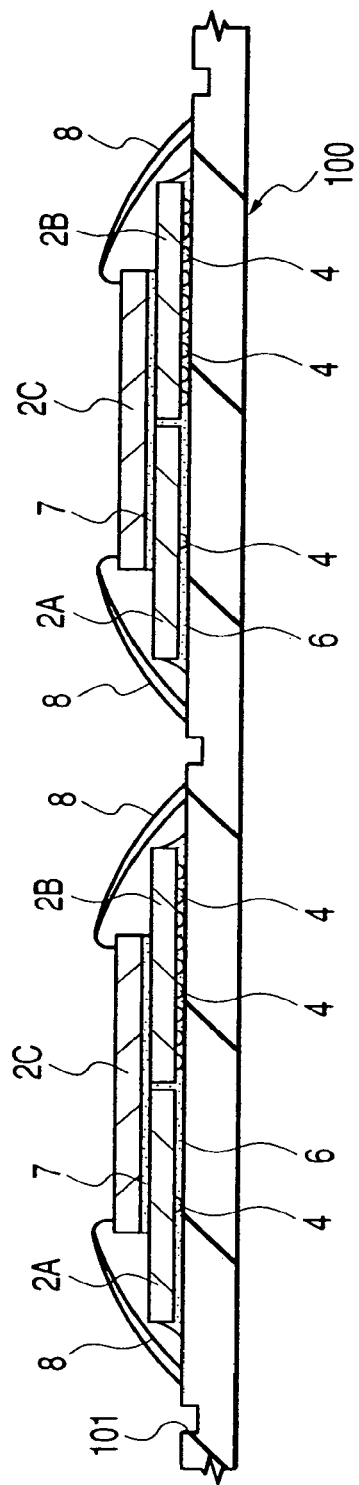
FIG. 21 is an enlarged sectional view of the multi-wiring substrate, showing the manufacturing method for the semiconductor device of the first embodiment.
Figure 22:
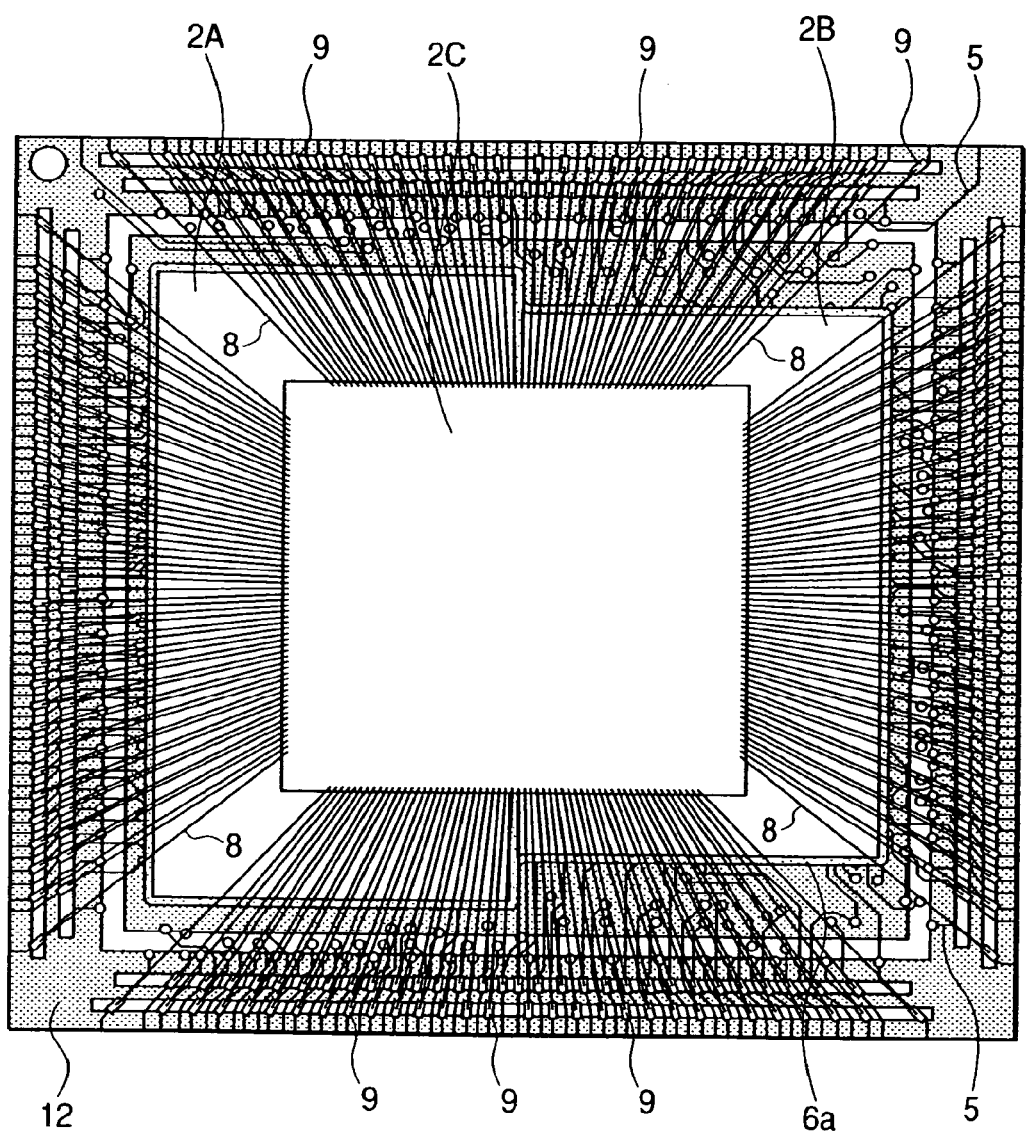
FIG. 22 is an enlarged plan view of a principal portion of the multi-wiring substrate, showing the manufacturing method for the semiconductor device of the first embodiment.

Next, as shown in FIGS. 21 and 22, the bonding pads 9 on the multi-wiring substrate 100 and the bonding pads 13 (not shown in FIGS. 21 and 22) on the chip 2C are connected together through Au wires 8. For example, the connection of the Au wires 8 is performed by means of a wire bonder which uses both ultrasonic oscillation and thermocompression bonding.

Figure 23:
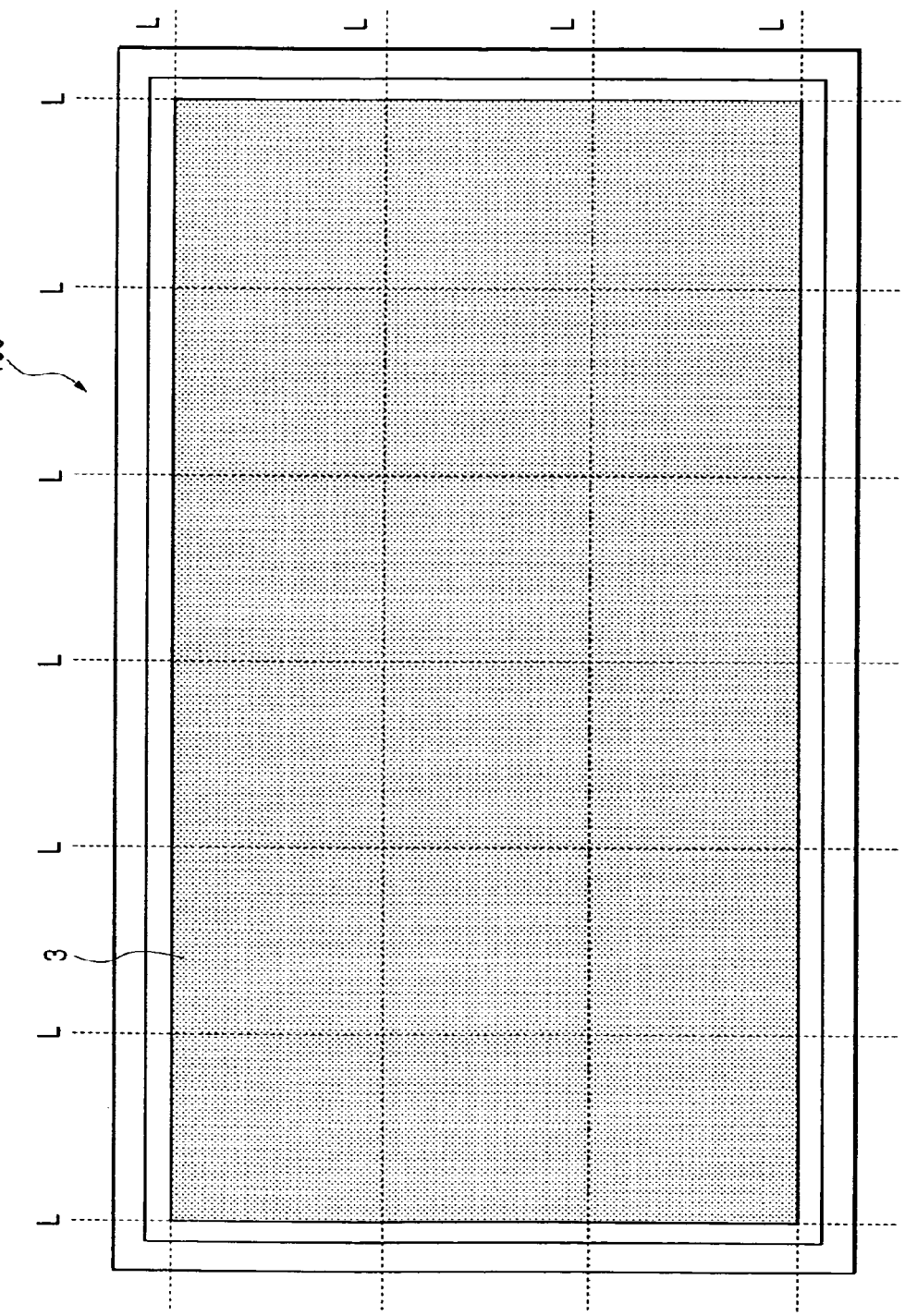
FIG. 23 is a plan view of the multi-wiring substrate, showing the manufacturing method for the semiconductor device of the first embodiment.

Then, as shown in FIGS. 23 and 24, the multi-wiring substrate 100 is loaded into a molding die (not shown) and the whole of the main surface of the multi-wiring substrate 100 is sealed with molding resin 3 at a time. The molding resin is a thermosetting epoxy resin with silica dispersed therein, the silica having a particle diameter of about 70 to 100 µm for example. As noted earlier, since the gap between the chips 2A, 2B and the multi-wiring substrate 100 and the gap between the chips 2A and 2B are filled with the under-fill resin 6 in advance, there is no fear of an air pocket (void) being formed in those gaps when the main surface of the multi-wiring substrate 100 is resin-sealed.

Next, as shown in FIG. 25, solder bumps 11 are connected to the electrode pads 9 (not shown in FIG. 25) formed on the back side of the multi-wiring substrate 100. The connection of the solder bumps 11 is performed, for example, by feeding solder balls of a low melting Pb—Sn eutectic alloy to the surfaces of the electrode pads 9 and by subsequently reflowing the solder balls.

Figure 2:
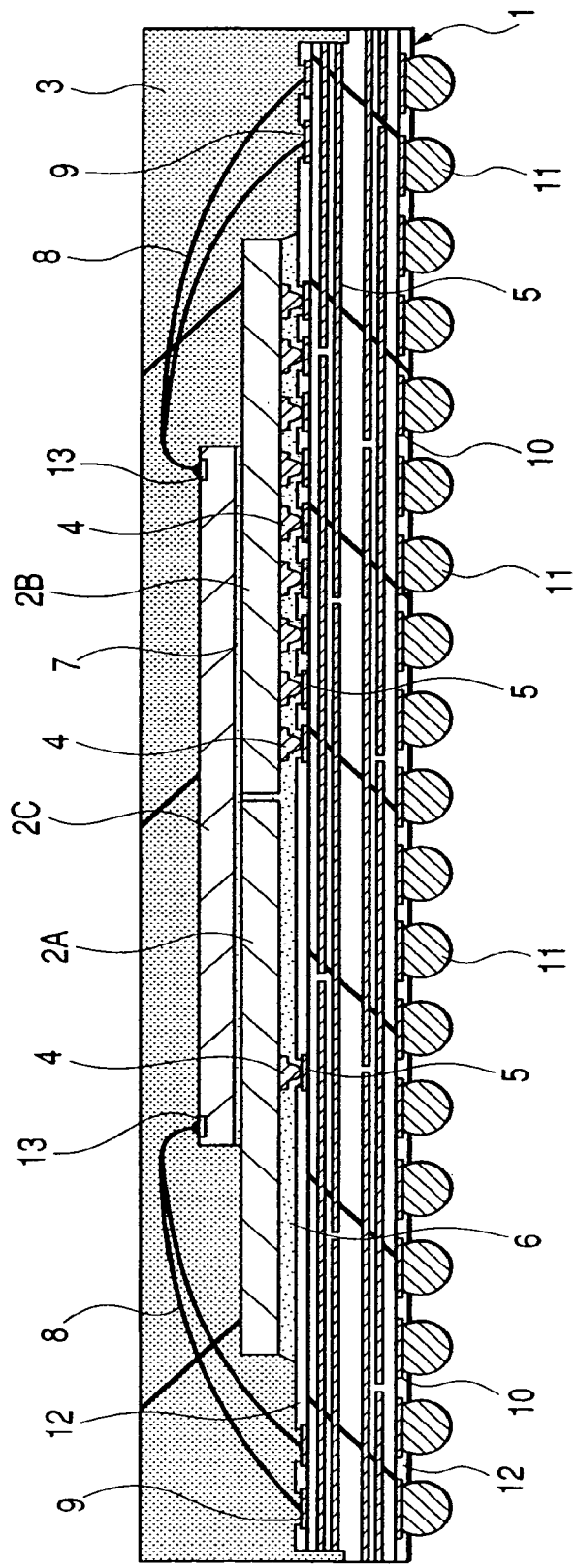
FIG. 2 is a sectional view of the semiconductor device of the first embodiment.
Figure 26:
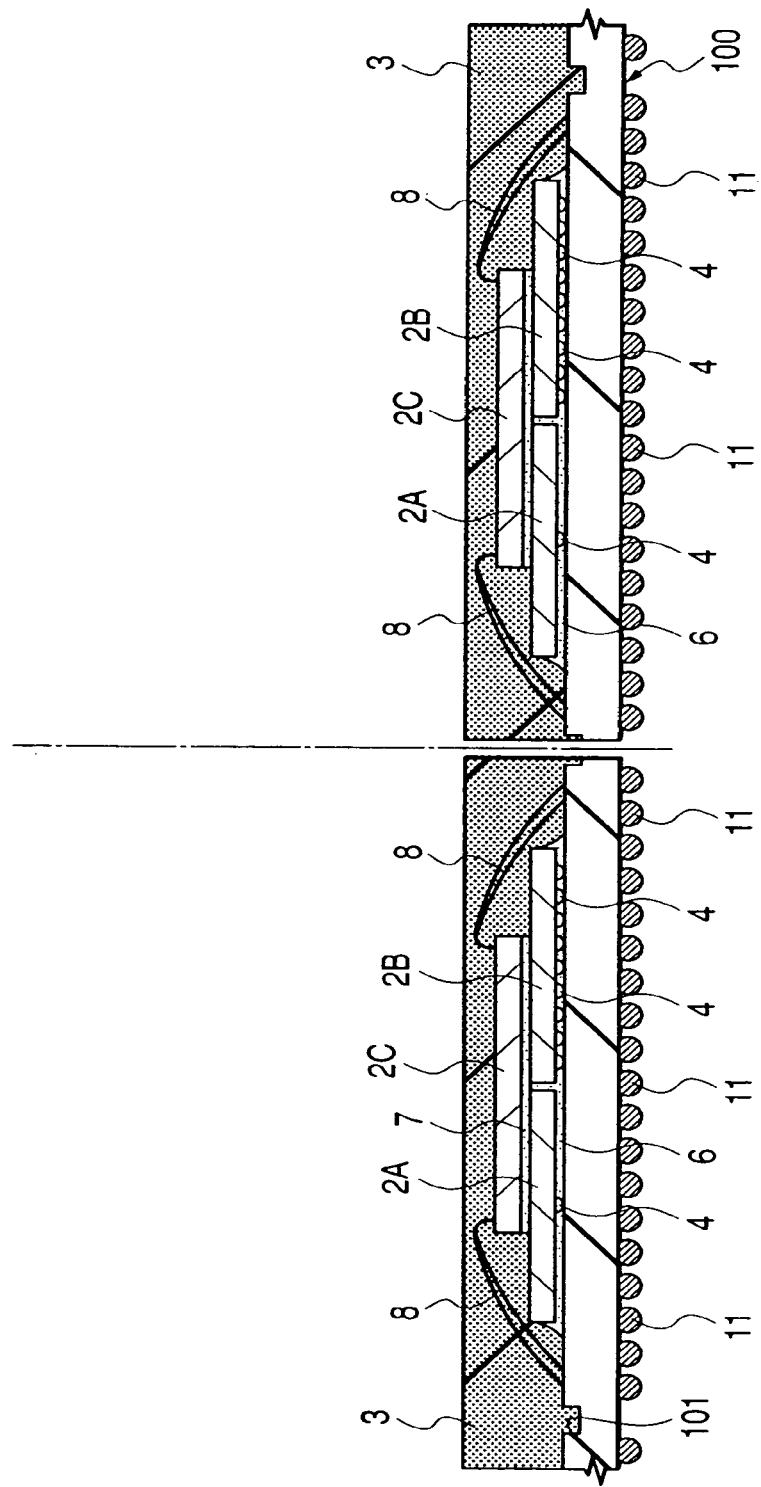
FIG. 26 is an enlarged sectional view of a principal portion of the multi-wiring substrate, showing the manufacturing method for the semiconductor device of the first embodiment.

Then, as shown in FIG. 26, the multi-wiring substrate 100 is diced into individual pieces along the dicing lines L shown in FIGS. 4 and 5, whereby the multi-chip module (MCM) of this embodiment shown in FIGS. 1 to 3 is completed. When dicing the multi-wiring substrate 100, there is used a dicing blade having a width smaller than the width of each of the grooves 101 (see FIGS. 6 and 7) formed in the dicing lines L of the multi-wiring substrate 100. By so doing, side faces of the package substrate 1 are partially covered with the molding resin 3 (see FIG. 2), so that the amount of moisture entering the side faces of the package substrate 1 from the side faces thereof is decreased and hence the reliability of the multi-chip module (MCM) is improved. The multi-chip module (MCM) resulting from the dicing process is mounted through the solder bumps 11 onto a mounting substrate, e.g., a printed circuit board (PCB).

Second Embodiment

A method of manufacturing a semiconductor device according to a second embodiment of the present invention will be described below step by step with reference to FIGS. 27 to 34.

In the previous first embodiment Au bumps 4 are formed on the main surface of the chip 2A with a DRAM formed thereon and also on the main surface of the chip 2B with a flash memory formed thereon, but in this second embodiment there are used solder bumps 20 instead of Au bumps 4.

Figure 27:
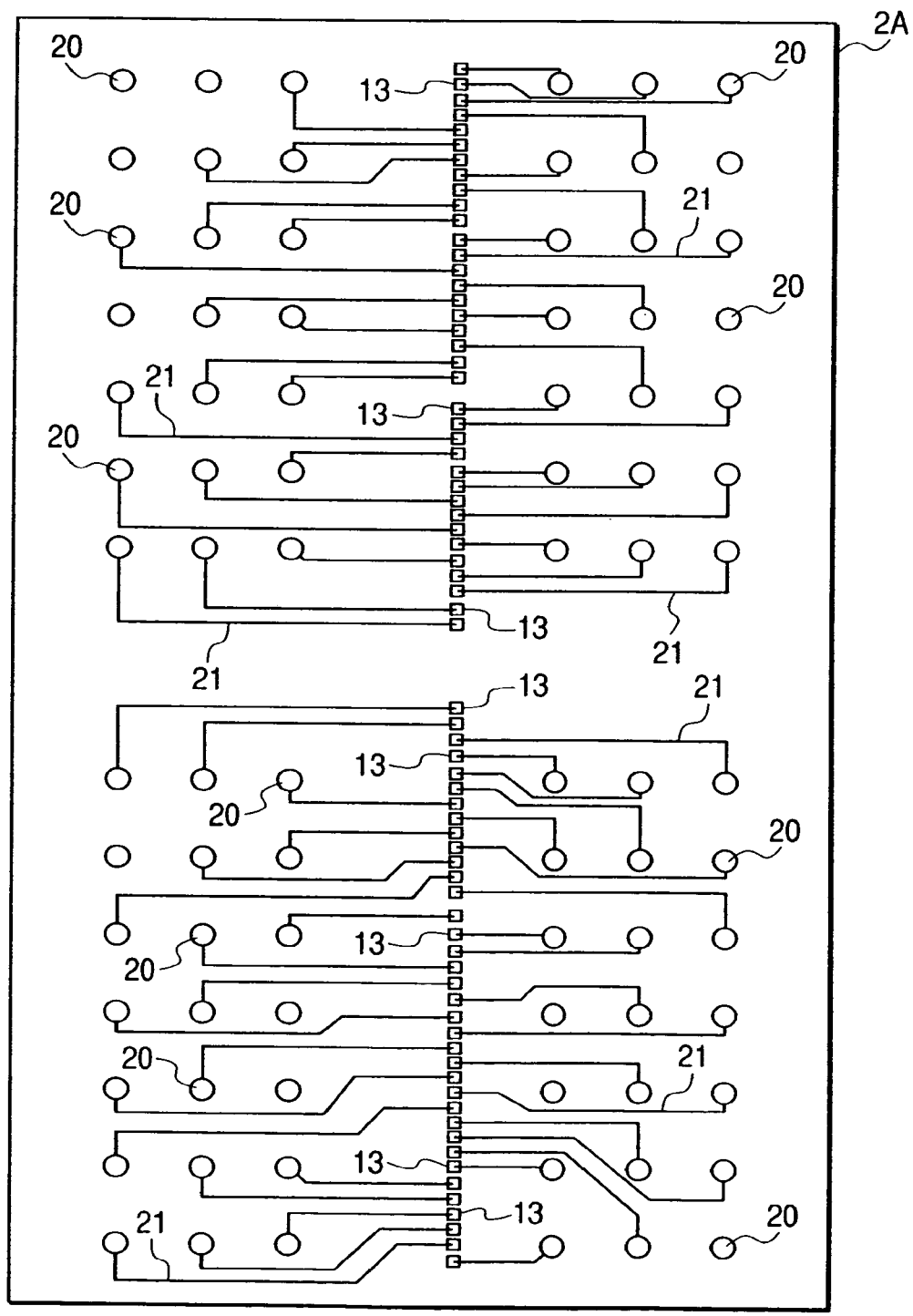
FIG. 27 is a plan view of a semiconductor chip used in manufacturing a semiconductor device according to a second embodiment of the present invention.

FIG. 27 is a plan view showing a state in which solder bumps 20 are formed on a main surface of a chip 2A with a DRAM formed thereon. As shown in the same figure, the solder bumps 20 are arranged in the form of an array on the main surface of the chip 2A. Bonding pads 13 and the solder bumps 20 are electrically connected with each other through Cu wiring lines 21 called re-wiring lines. The Cu wiring lines 21 function as an interposer for converting the pitch of the bonding pads 13 to the pitch of the solder bumps 20, whereby the pitch of the solder bumps 20 can be made wider than that of the bonding pads 13, so that the expensive build-up substrate need not be used as the package substrate 1 and it is possible to use a less expensive resin substrate having a wide pitch of wiring lines 5.

The Cu wiring lines 21 and the solder bumps 20 are formed in the final step of the wafer process. That is, after an organic insulating film such as a polyimide resin film is formed on a surface protecting film of a wafer, Cu wiring lines 21 are formed on the organic insulating film by an electrolytic plating method for example. The Cu wiring lines 21 and the bonding pads 13 are electrically connected with each other through through-holes formed in the organic insulating film on the bonding pads 13. The solder bumps 20 are formed by printing solder paste to one ends of the Cu wiring lines 21 by a screen printing method and by subsequently heating the wafer to melt the solder paste. For example, the solder bumps 20 are constituted by a Pb—Sn alloy (liquidus line temperature: 320° C. to 325° C.) including 2 wt % of Sn. Though not shown, Cu wiring lines 21 and solder bumps 20 are formed in the same manner also on a main surface of a chip 2B with a flash memory formed thereon.

Figure 28:
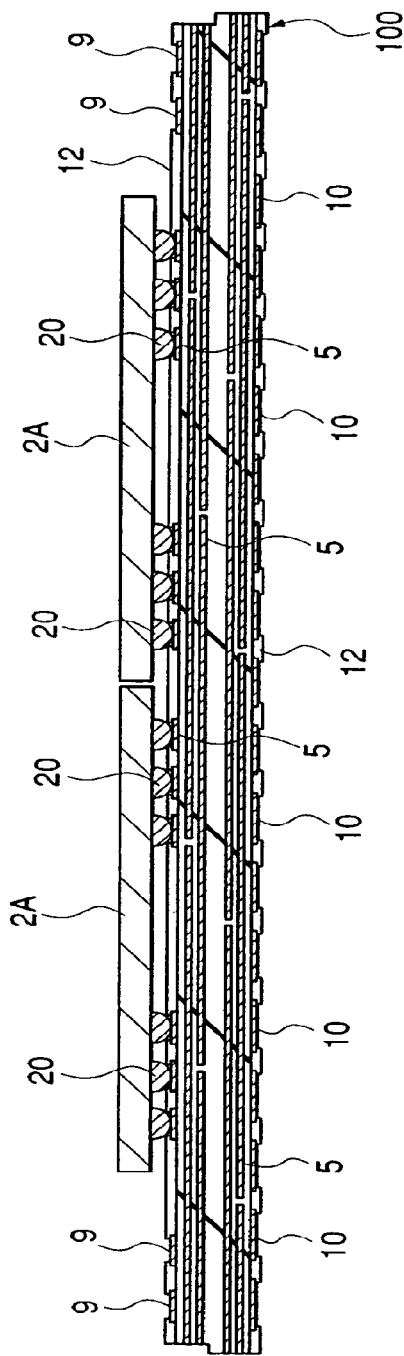
FIG. 28 is an enlarged sectional view of a principal portion of a multi-wiring substrate, showing a method of manufacturing the semiconductor device of the second embodiment.

Next, as shown in FIG. 28, the chips 2A and 2B are positioned in each of package substrate-forming areas of a multi-wiring substrate 100, then the multi-wiring substrate 100 is heated to about 340° C. within an electric furnace to reflow the solder bumps 20, thereby electrically connecting the solder bumps 20 on the chips 2A and 2B with the wiring lines 5 on the multi-wiring substrate 100.

Figure 29:
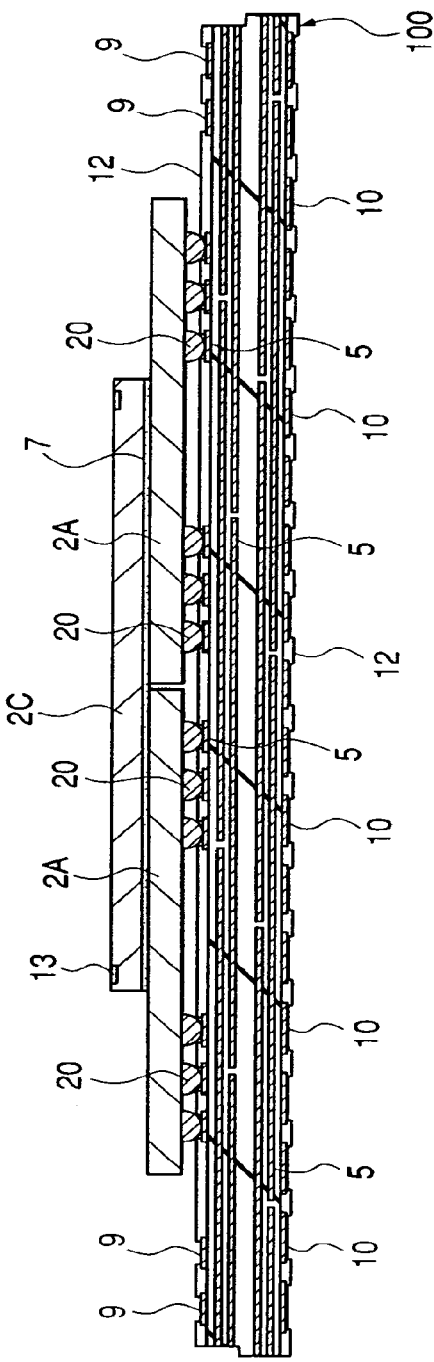
FIG. 29 is an enlarged sectional view of a principal portion of the multi-wiring substrate, showing the manufacturing method for the semiconductor device of the second embodiment.

Then, as shown in FIG. 29, a chip 2C is mounted on the two chips 2A and 2B. As in the first embodiment, bonding of the chip 2C with the chips 2A and 2B is performed using an adhesive 7 affixed to a back side of the chip 2C.

Figure 30:
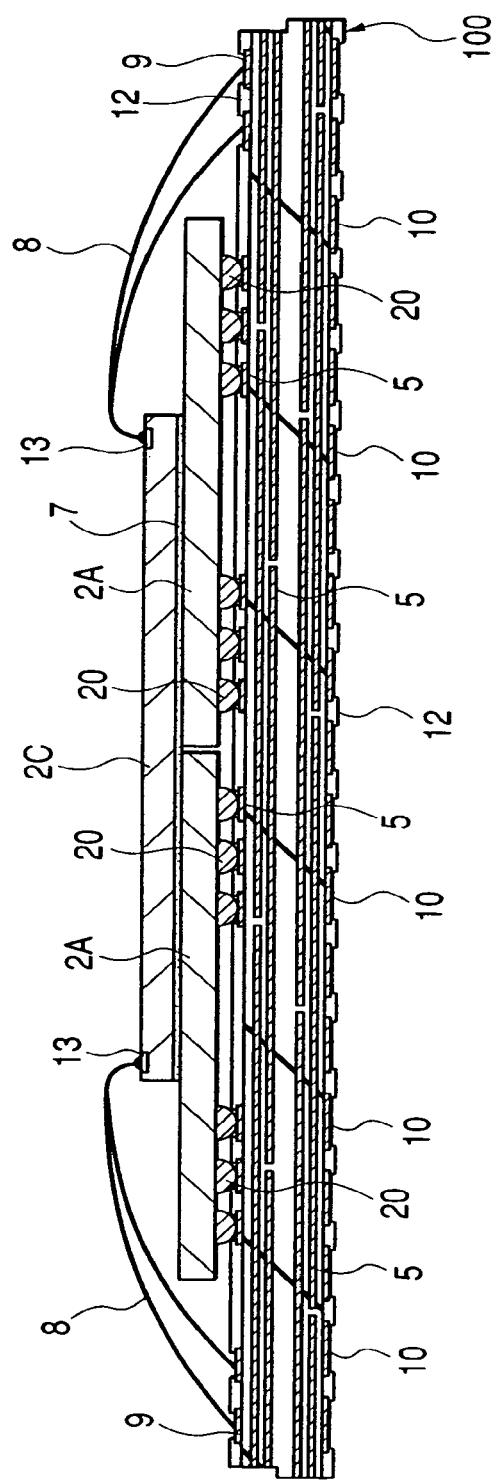
FIG. 30 is an enlarged sectional view of a principal portion of the multi-wiring substrate, showing the manufacturing method for the semiconductor device of the second embodiment.
Figure 31:
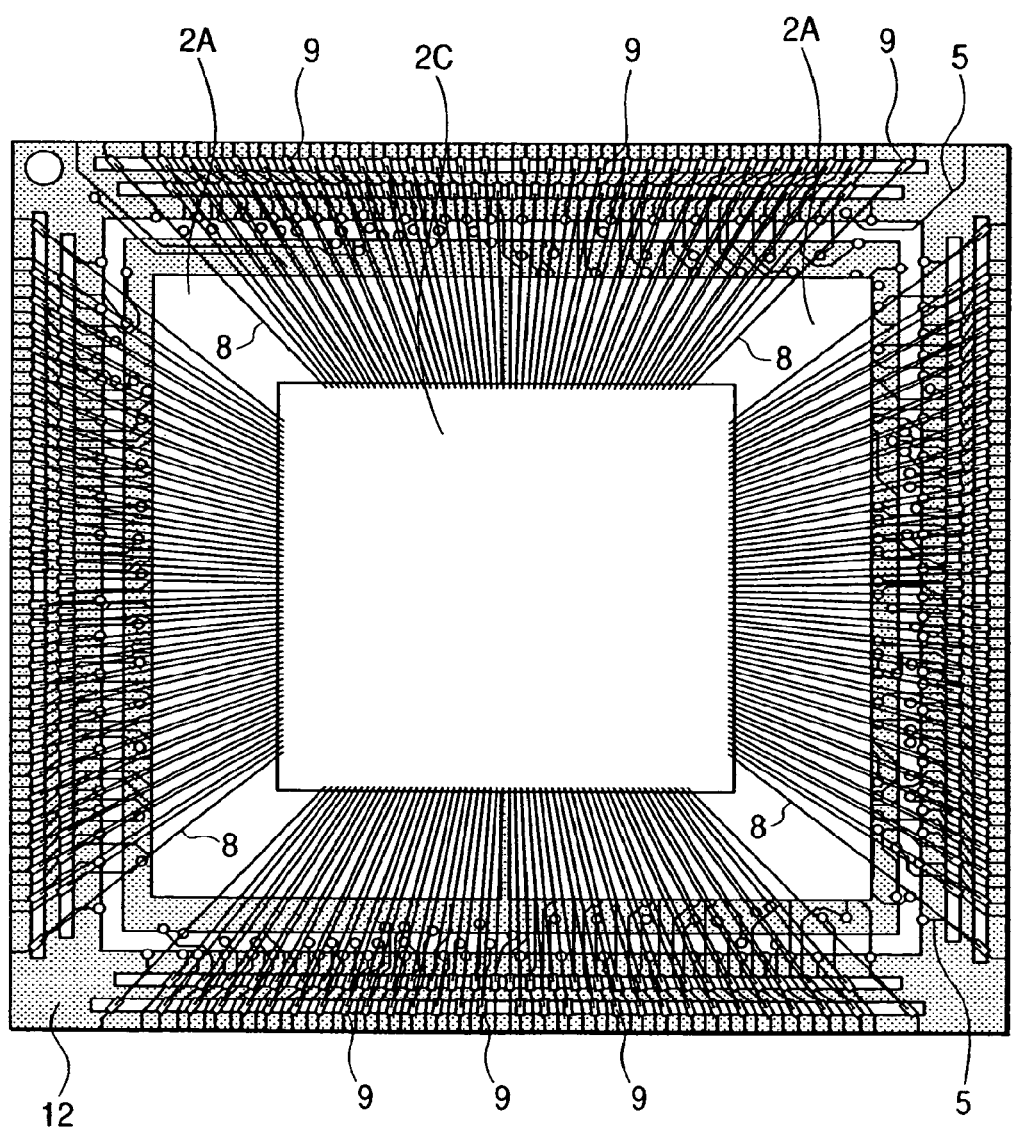
FIG. 31 is an enlarged plan view of a principal portion of the multi-wiring substrate, showing the manufacturing method for the semiconductor device of the second embodiment.

Next, as shown in FIGS. 30 and 31, bonding pads 9 on the multi-wiring substrate 100 and bonding pads 13 on the chip 2C are connected together through Au wires 8. As in the first embodiment, the connection of the Au wires 8 is performed for example by means of a wire bonder which uses both ultrasonic oscillation and thermocompression bonding.

Then, as shown in FIG. 32, a liquid under-fill resin 6 is fed to the peripheral portions of the chips 2A and 2B with used of a dispenser or the like and is thereafter heated and cured, whereby the gap between the chips 2A, 2B and the multi-wiring substrate 100 and the gap between the chips 2A and 2B are filled with the under-fill resin 6. Since the liquid under-fill resin 6 is high in fluidity and the particle diameter (about 3 μm) of the silica filler added therein is smaller than the gap (about 20 to 100 μm) between the chips 2A and 2B, the chip-to-chip gap can be filled completely with the under-fill resin 6.

In this embodiment, when the liquid under-fill resin 6 is fed to the peripheral portions of the chips 2A and 2B, it is also fed to the peripheral portions of the package substrate-forming areas to cover the surfaces of the bonding pads 13 with the under-fill resin 6. It is not necessary for the under-fill resin 6 to cover the surfaces of all the bonding pads 13 completely. If the under-fill resin 6 is cured in this state, one end portions of the Au wires 8 connected to the surfaces of the bonding pads 13 are fixed by the under-fill resin 6, so that the reliability of connection between the bonding pads 13 and the Au wires 8 is improved. Besides, since the wire bonding process is completed before the injection of the under-fill resin 6, it is possible, with the under-fill resin 6, to avoid contamination of the electrode pads formed on the substrate.

Next, as shown in FIG. 33, the multi-wiring substrate 100 is loaded into a molding die (not shown) and the whole of a main surface thereof is sealed with a molding resin 3 at a time. The molding resin 3 is, for example, a thermosetting epoxy resin with silica dispersed therein, the silica having a particle diameter of about 70 to 100 μm. As noted earlier, the gap between the chips 2A, 2B and the multi-wiring substrate 100 and the gap between the chips 2A and 2B are filled with the under-fill resin 6 beforehand, there is no fear of an air pocket (void) being formed when the main surface of the multi-wiring substrate 100 is resin-sealed. In this embodiment, moreover, since one end portions of the Au wires 8 are fixed to the surfaces of the bonding pads 13 through the under-fill resin 6, it is possible to surely prevent breaking of Au wires 8 caused by pressure at the time of injection of melted molding resin 3 into the molding die.

Then, as shown in FIG. 34, the solder bumps 11 are connected to electrode pads 10 formed on a back side of the multi-wiring substrate 100. Though not shown, the multi-chip module (MCM) of this embodiment is completed by dicing the multi-wiring substrate 100 in the same manner as in the first embodiment.

Third Embodiment

A method of manufacturing a semiconductor device according to a third embodiment of the present invention will be described below with reference to FIGS. 35 to 37.

First, as shown in FIG. 35, solder bumps 20 on chips 2A, 2B and wiring lines 5 on a multi-wiring substrate 100 are electrically connected with each other, then a chip 2C is mounted on the two chips 2A and 2B through an adhesive 7, and thereafter bonding pads 9 on the multi-wiring substrate 100 and bonding pads 13 on the chip 2C are connected together through Au wires 8. These steps are the same as those shown in FIGS. 27 to 31 in the previous second embodiment.

Then, as shown in FIG. 36, the multi-wiring substrate 100 is loaded into a molding die (not shown) and the whole of a main surface thereof is sealed with resin at a time. At this time, in this embodiment there is used a molding resin 3 with a silica filler added therein, the silica filler having a particle diameter of about 3 μm, as is the case with the under-fill resin 6 used in the previous first and second embodiments. The particle diameter of the silica filler added to the molding resin 3 is smaller than the gap (about 20 to 100 μm) between the chips 2A and 2B, so that the gap between the chips 2A, 2B and the multi-wiring substrate 100, as well as the gap between the chips 2A and 2B, can be filled with the molding resin 3 completely. This molding resin 3 is expensive in comparison with the molding resin 3 with silica of about 70 to 100 μm in particle diameter added therein which was used in the first and second embodiments, but permits omission of the step of injecting the under-fill resin 6 into the gap between the chips 2A, 2B and the multi-wiring substrate 100 and the gap between the chips 2A and 2B.

Next, as shown in FIG. 37, solder bumps 11 are connected to electrode pads 9 on a back side of the multi-wiring substrate 100 in the same way as in the first and second embodiments. Thereafter, though not shown, the multi-wiring substrate 100 is diced in the same manner as in the first and second embodiment to complete the multi-chip module (MCM) of this embodiment.

Fourth Embodiment

Figure 38:
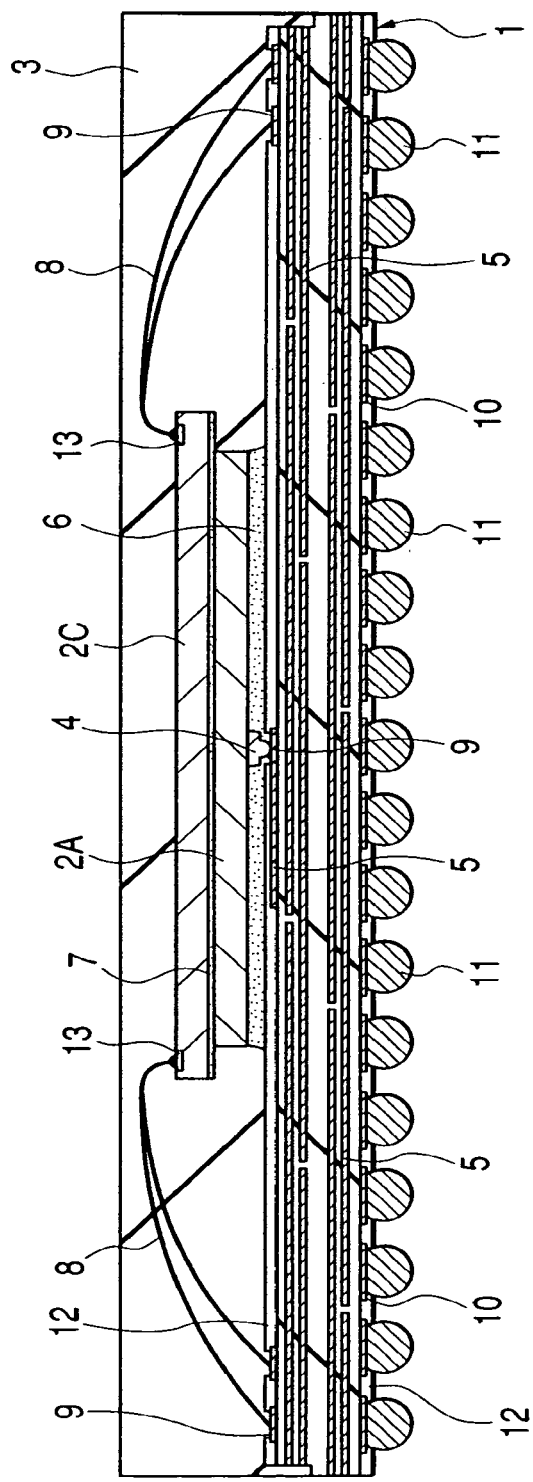
FIG. 38 is a sectional view of a semiconductor device according to a fourth embodiment of the present invention.
Figure 39:
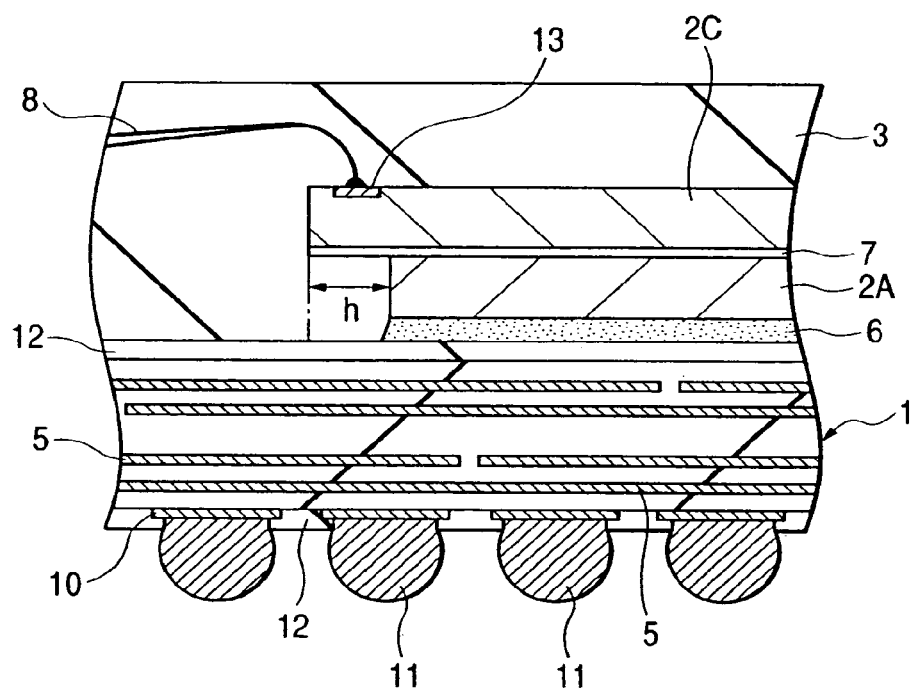
FIG. 39 is a sectional view showing a part of FIG. 38 on a larger scale.

FIG. 38 is a sectional view showing a semiconductor device according to a fourth embodiment of the present invention and FIG. 39 is a sectional view showing a part of FIG. 38 on a larger scale.

In the semiconductor device of this embodiment is a multi-chip module (MCM) wherein a chip 2A with a DRAM formed thereon is mounted on a main surface of a package 1, a chip 2C with a high-speed microprocessor (MPU) formed thereon is stacked on the chip 2A, and the two chips 2A and 2C are sealed with a molding resin 3.

The underlying chip 2A is electrically connected to wiring lines 5 on the package substrate 1 through Au bumps 4 formed on the main surface of the package substrate 1. That is, the chip 2A is mounted in accordance with a flip-chip method. A gap is formed between a main surface (lower surface) of the chip 2A and the main surface of the package substrate 1 and is filled with an under-fill resin 6.

The overlying chip 2C is bonded to an upper surface of the chip 2A through an adhesive 7. Bonding pads 13 formed on a main surface of the chip 2C are electrically connected to bonding pads 9 on the package substrate 1 through plural Au wires 8. That is, the chip 2C is mounted in accordance with a wire bonding method.

Plural electrode pads 10 connected electrically to the wiring lines 5 are arranged in the form of an array on a lower surface of the package substrate 1 which packages the two chips 2A and 2C, and solder bumps 11 which constitute external connecting terminals (pins) of the multi-chip module (MCM) are connected respectively to the electrode pads 10. The main surface and lower surface of the package substrate 1 are coated with a solder resist 12 such as an epoxy resin or an acrylic resin exclusive of the surfaces of the connections between the wiring lines 5 and the chip 2A and of the bonding pads 9 and electrode pads 10.

As shown in FIG. 13, the chip 2A with a DRAM formed thereon has a rectangular shape in plan and plural Au bumps 4 are arranged in a row centrally of the main surface of the chip 2A. The chip 2C with a microprocessor formed thereon has a generally square shape in plan and bonding pads 13 are formed along the four sides of the main surface of the chip 2C. The number of bonding pads 13 formed on the chip 2C is larger than the number of bonding pads (Au bumps 4) formed on the chip 2A.

As noted earlier, when the chip 2A having a small number of bonding pads and a large minimum pitch of bonding pads and the chip 2C having a large number of bonding pads and a small minimum pitch of bonding pads are to be stacked one on the other, the chip 2A having a large minimum pitch of bonding pads is face-down mounted through Au bumps 4, while the chip 2C having a small minimum pitch of bonding pads is face-up mounted by wire bonding. By so doing, the requirement for the wiring density of the package substrate 1 can be eased, so that it becomes possible to use a less expensive substrate as the package substrate 1 and provide a package of a low cost and which permits a high-density packaging.

As shown in FIG. 39, when the chip 2C having a generally square plan shape is stacked on such a single chip 2A having a rectangular plan shape as noted above, there sometimes occurs a case where the peripheral portion of the overlying chip 2C protrudes outwards (overhangs) from the peripheral portion of the underlying chip 2A.

In this case, if the overhanging quantity of the overlying chip 2C is large, there is a fear that the chip 2C may be cracked under a load applied to the peripheral portion of the chip 2C at the time of bonding Au wires 13 onto the bonding pads 13 formed in the peripheral portion of the chip 2C. As a countermeasure there is proposed a method wherein the amount of the resin injected into the gap between the underlying chip and the substrate is increased to let the resin be injected also just under the peripheral portion of the chip 2C (Japanese Unexamined Patent Publication No. 2000-299431). According to this method, even if a load is applied to the peripheral portion of the overlying chip 2C in wire bonding, it is possible to prevent cracking of the chip 2C because the peripheral portion of the chip 2C is supported with resin.

According to the above countermeasure, however, since the overhanging quantity of the under-fill resin 6 from the underlying chip 2A to the outer periphery thereof is controlled by controlling the amount of the same resin fed, it is difficult to control the overhanging quantity accurately. Particularly, if the bonding pads on the main surface of the package substrate 1 are contaminated by excess overhanging of the under-fill resin 6, there is a fear that a disconnection defect between the bonding wires and the bonding pads 9 may occur in the subsequent wire bonding step. For solving such a problem, that is, for preventing contamination of the bonding pads 9 even with excess overhanging of the under-fill resin 6, if an attempt is made to ensure a sufficient distance from the area where the bonding pads 13 of the overlying chip 2C are arranged up to the bonding pads 9, this attempt leads to an increase in size of the package substrate 1 and hence of the MCM, which is not desirable.

In this embodiment, as shown in FIG. 39, for avoiding contamination of the bonding pads 9 even when there are variations in the overhanging quantity of the under-fill resin 6, there is adopted a construction wherein the bonding pads 13 of the overlying chip 2C are not supported by the overhanging portion of the under-fill resin 6 in the case where the overlying chip 2C overhangs outside the underlying chip 2A. Further, for avoiding crack of the overlying chip 2C in the wire bonding step, the length (h) of an unsupported portion of the overlying chip 2C is set at a value of not larger than 1.5 mm, preferably not larger than 1 mm.

Figure 40:
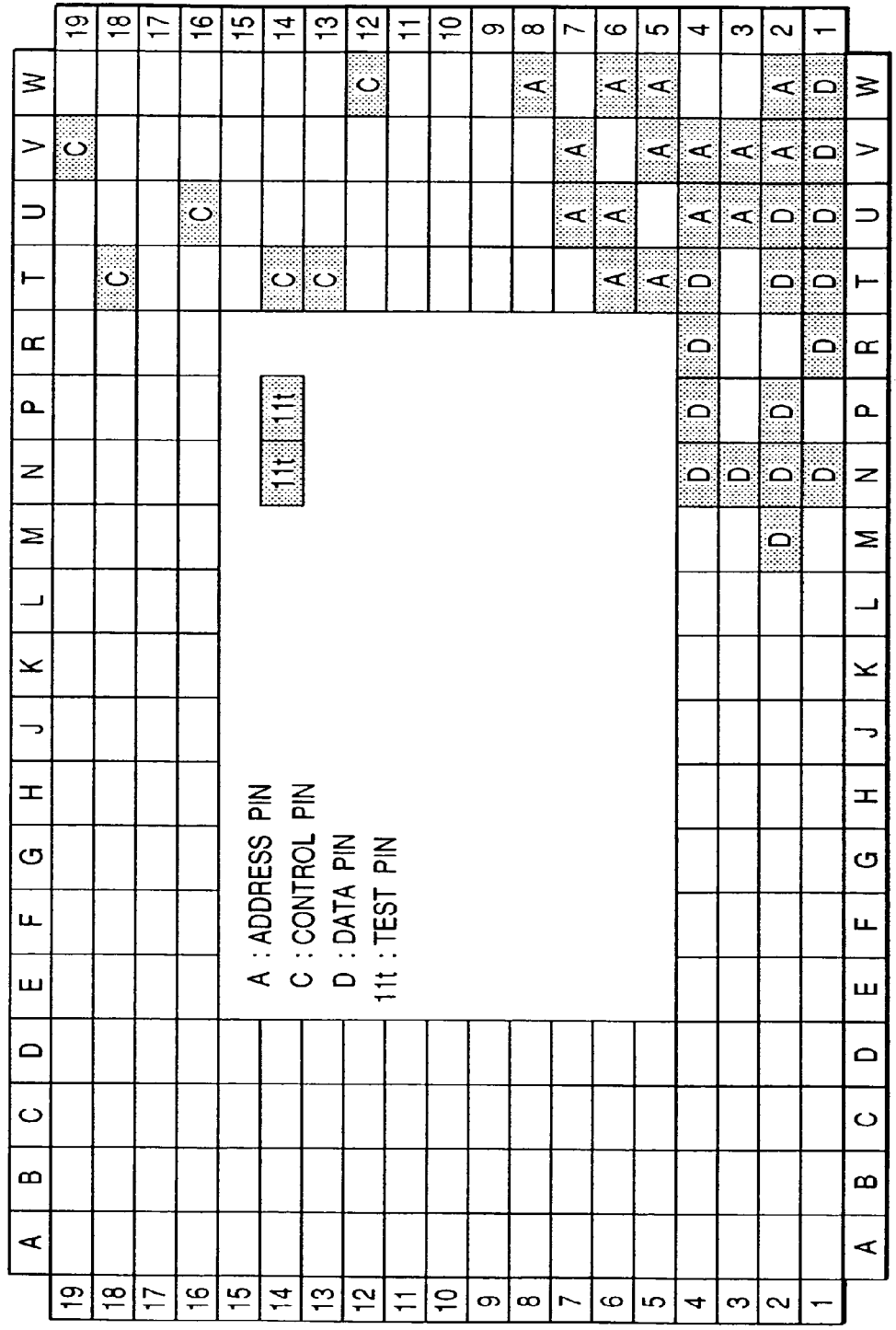
FIG. 40 is a pin (terminal) layout diagram in the semiconductor device of the fourth embodiment.

FIG. 40 is a layout diagram of pins (terminals) of the multi-chip module (MCM) according to this embodiment.

The package substrate 1 used in the multi-chip module (MCM) of this embodiment has a pin layout common to a package substrate designed for mounting a single chip 2C with a high-speed microprocessor formed thereon. Therefore, out of the pins shown in FIG. 40, control pins (CASL, RASL, CS3, RDWR, WE1, WE0, all of which will hereinafter be referred to as "C"), address pins (A0 to A14, all "A" hereinafter), and data pins (D0 to D15, all "D" hereinafter), are connected using common wiring lines 5.

In case of constituting the multi-chip module (MCM) by mounting the chip 2A in addition to the chip 2C, it is necessary for the package substrate 1 to be provided with pins (two or so in the case of DRAM) for testing characteristics of the chip 2A in addition to pins for testing electric characteristics of the chip 2C. In this embodiment, therefore, as shown in FIG. 41, test pins 11t for the chip 2A are arranged just under the chip mounting area.

In this case, if the test pins 11t are arranged near the center of the package substrate 1, the wiring lines 5 connected to the test pins become longer and hence the wiring design for the package substrate 1 becomes difficult. On the other hand, in order to make shortest the length of the wiring lines 5 connected to the test pins 11t, if the test pins 11t are arranged in adjacency to the area where other pins (solder bumps 11) are arranged, the distance between the other pins (solder bumps 11) and the test pins 11t becomes shorter, so that it becomes difficult to make layout of the wiring lines 5 connected to other pins which are adjacent to the test pins 11t; in this case, it becomes difficult to make wiring design for the mounting substrate which is for mounting the MCM.

Figure 41:
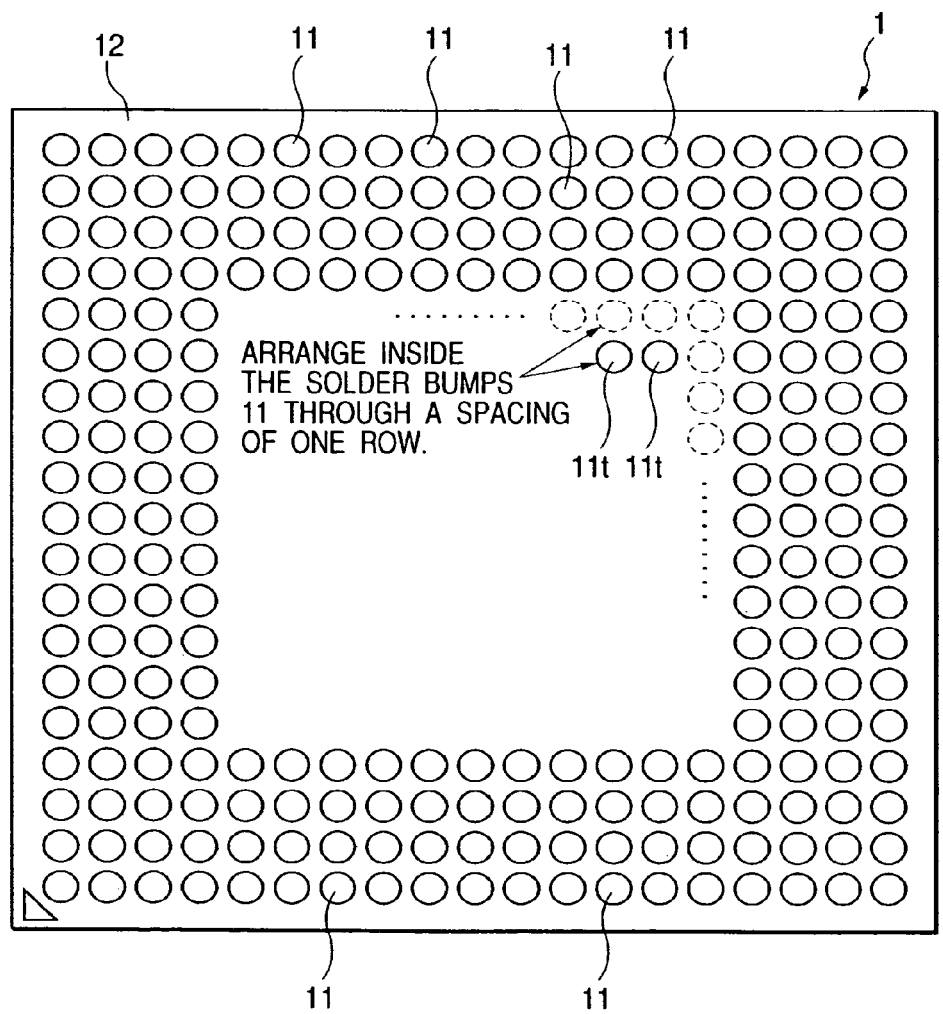
FIG. 41 is a plan view of a multi-wiring substrate, showing a layout of test pins in the semiconductor device of the fourth embodiment.

For solving the above-mentioned problem, as shown in FIG. 41, the test pins 11t should not be arranged in adjacency to the area where other pins (solder bumps 11) are arranged, but it is preferable that the test pins 11t be arranged inside the other pins through a spacing of one row. In the case where two or more non-connection pins are included in the other pins (solder bumps 11), the test pins 11t may be arranged in the area where the non-connection pins are arranged.

Thus, the multi-chip module (MCM) is constituted using the package substrate 1 having a pin layout (exclusive of the test pins 11t) common to the package substrate which is designed for mounting a single chip 1C with a high-speed microprocessor (MPU) formed thereon. With this construction, it is possible to reduce the design cost of the package substrate 1, and also to improve ease in handling the package substitute 1.

Figure 42:
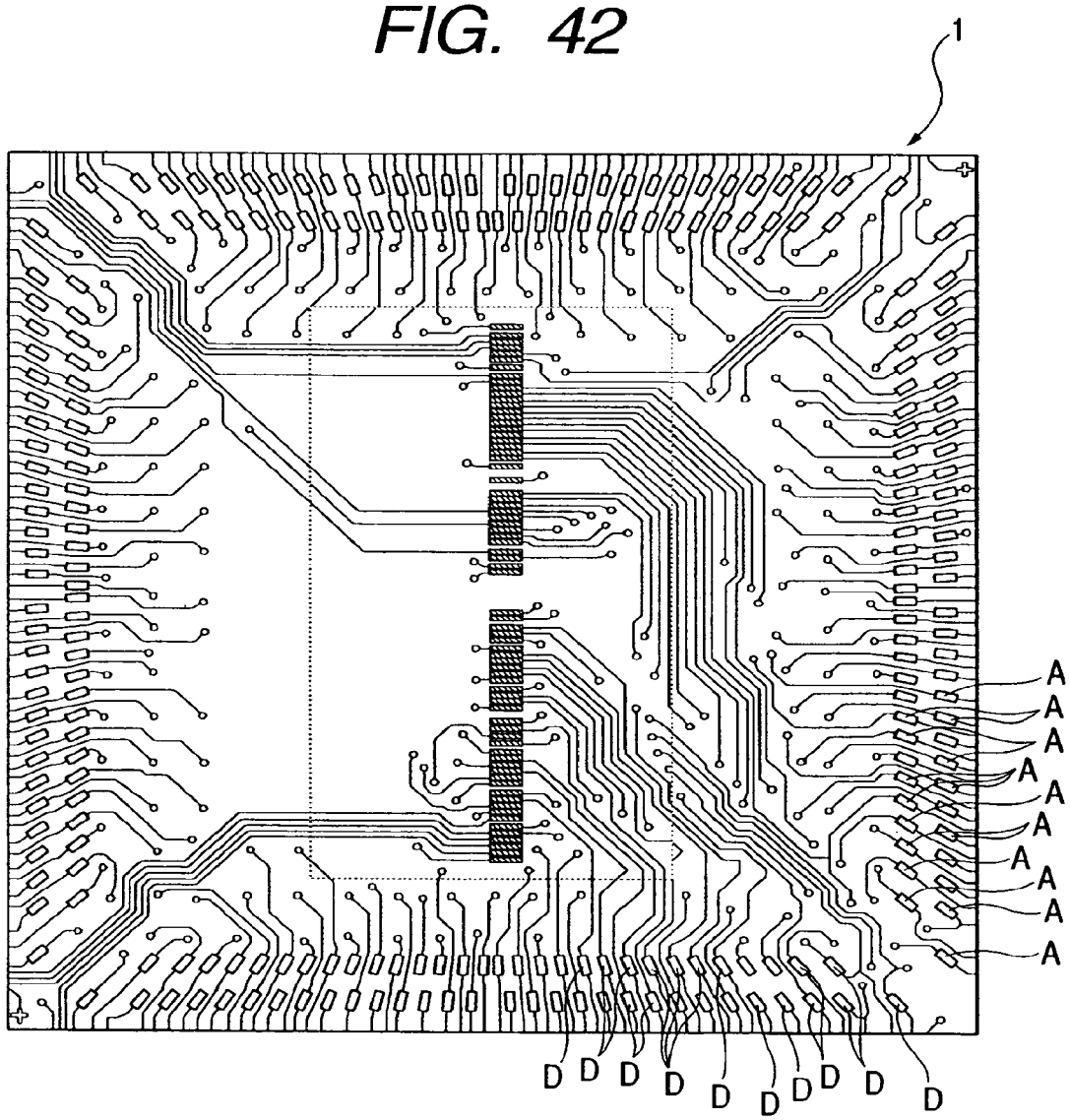
FIG. 42 is a plan view of the multi-wiring substrate, showing a layout of a group of address pins and a group of data pins in the semiconductor device of the fourth embodiment.

FIG. 42 illustrates a layout of a group of address pins (A) and a group of data pins (D) on the package substrate 1. As shown in the same figure, in the package substrate 1 for packaging the chip 2C having a large number of pins, like a high-speed microprocessor (MPU), generally address pins (A) are concentrated in a specific area and so are data pins (D), further, the group of address pins (A) and the group of data pins (D) are arranged adjacent each other, whereby it is possible to shorten the wiring length for example when the package substrate 1 is connected to an external memory chip.

Figure 43:
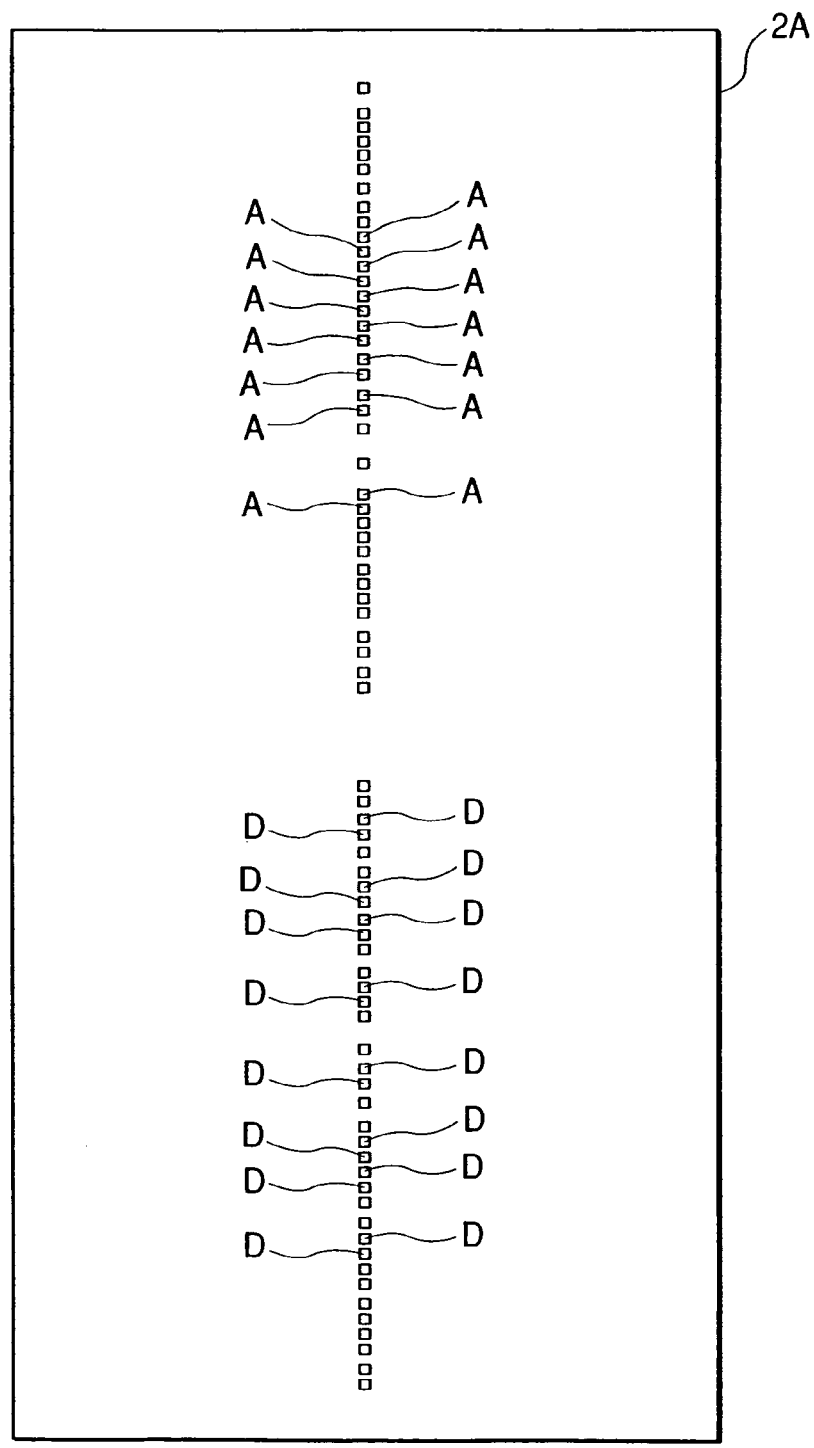
FIG. 43 is a plan view showing a layout of a group of address pins and a group of data pins on a memory chip.

On the other hand, in the chip 2A with a DRAM formed thereon, generally a group of address pins (A) is disposed on one end side and a group of data pins (D) is disposed on an opposite end side in the longitudinal direction of the chip 2A, as shown in FIG. 43.

Figure 44:
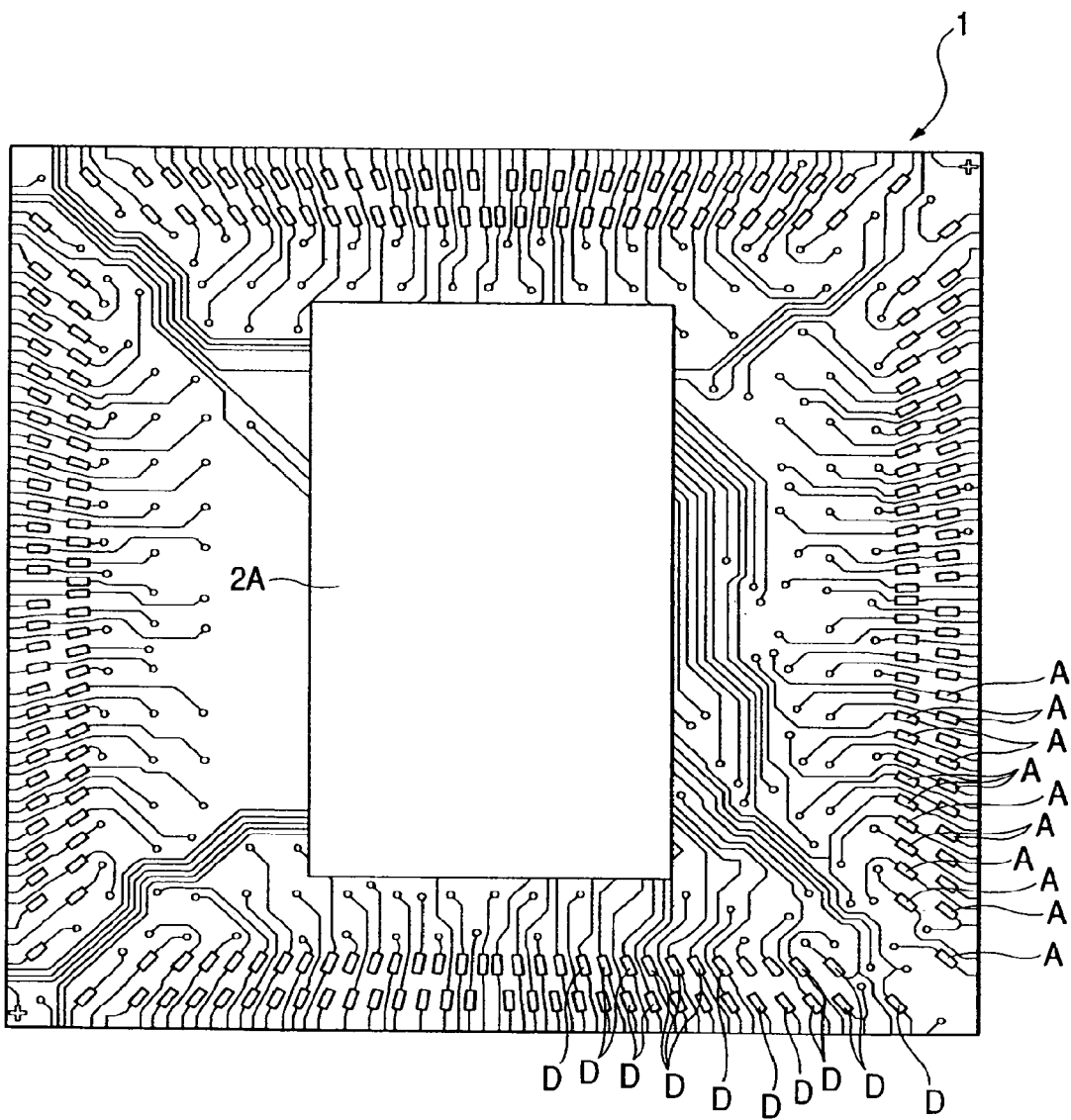
FIG. 44 is a plan view showing an optimal memory chip mounting direction in the semiconductor device of the fourth embodiment.

Therefore, in case of constituting the multi-chip module (MCM) by stacking the chip 2C on the chip 2A as in this embodiment, it is preferable for the chip 2A to be oriented so that a group of address pins (A) on the package substrate 1 and a group of address pins (A) on the chip 2A are arranged adjacent each other and so are a group of data pins (D) on the package substrate 1 and a group of data pins (D) on the chip 2A, as shown in FIG. 44.

According to such a layout, a group of wiring lines 5 for connection between the group of address pins (A) on the package substrate 1 and the group of address pins on the chip 2A and a group of wiring lines 5 for connection between the group of data pins (D) on the package substrate 1 and the group of data pins (D) on the chip 2A can be prevented from crossing each other and therefore the wiring design of the package substrate 1 becomes easier.

FIGS. 45(a) to (c) show a layout example of a group of address pins (A) and a group of data pins (D) on the package substrate 1, in which the area indicated with symbol (D>A) represents an area in which data pins (D) are mainly arranged, while the area indicated with symbol (A>D) represents an area in which address pins (A) are mainly arranged. In these examples, if the chip 2A with a DRAM formed thereon is oriented as illustrated in the figures, a group of wiring lines 5 for connection between a group of address pins (A) on the package substrate 1 and a group of address pins (A) on the chip 2A and a group of wiring lines 5 for connection between a group of data pins (D) on the package substrate 1 and a group of data pins (D) on the chip 2A can be prevented from crossing each other on the package substrate 1.

In the multi-chip module (MCM) of this embodiment the chip 2C is stacked on the chip 2A with a DRAM formed thereon, but also in case of constituting a multi-chip module (MCM) by stacking the chip 2C on the chip 2B with a flash memory formed thereon, as shown in FIG. 14 for example, it is preferable that the chip 2B be oriented in the same manner as above.

More specifically, generally in the chip 2B with a flash memory formed thereon like that shown in FIG. 14, a group of address pins (A) is disposed along one of two short sides opposed to each other and a group of data pin (D) is disposed along the other short side. Therefore, also in this case, the chip 2B is oriented so that a group of address pins (A) on the package substrate 1 and a group of address pins (A) on the chip 2B are arranged adjacent each other and so are a group of data pins (D) on the package substrate 1 and a group of data pins (D)O on the chip 2B, whereby a group of wiring lines 5 for connection between the group of address pins (A) on the package substrate 1 and a group of address pins (A) on the chip 2B and a group of wiring lines 5 for connection between the group of data pins (D) on the package substrate 1 and the group of data pins (D) on the chip 2B can be prevented from crossing each other on the package substrate 1.

In case of stacking the chip 2C with a high-speed microprocessor (MPU) formed thereon onto both chip 2A with a DRAM formed thereon and chip 2B with a flash memory formed thereon, like the multi-chip module (MCM) of the first embodiment, there sometimes occurs a case where the center of both chips 2A and 2B serving as a base of the MPU chip 2C does not coincide with the center of the package substrate 1. Usually, in case of stacking chips on a wiring substrate, a chip to be stacked is aligned with a base chip. However, if the MPU chip 2C which is larger in the number of pins and smaller in the minimum bonding pad pitch than the DRAM chip 2A and flash chip 2B is offset from the center of the module substrate 1 in an effort to be aligned with the center of the underlying chips, there arise problems such as the bonding wires being non-uniform in length.

More particularly, the number of bonding pads 9 on the module substrate 1 necessary for the connection thereof with the MPU chip 2C is very large, so by arranging the bonding pads 9 along the outer periphery of the module substrate 1, it is possible to ensure a required spacing of the bonding pads 9. However, the greater the degree of offset of the MPU chip 2C from the module substrate 1, the more irregular the distance between the bonding pads 13 arranged along the outer periphery of the MPU chip 2C and the bonding pads 9 on the module substrate 1, so that the bonding wires 8 become irregular in length and there is a fear of occurrence of problems such as wire deformation at the time of sealing with resin and short-circuit particularly in longer portions of the bonding wires 8.

For solving these problems and for making uniform the distance between the bonding pads 13 and the bonding pads 9 in a misaligned state of the MPU chip 2C with the module substrate 1, it is necessary to narrow the spacing of the bonding pads 9 so that the bonding pads 9 are received on the main surface of the module substrate 1 or increase the size of the module substrate 1 so that all of the bonding pads 9 can be arranged thereon.

Therefore, also in case of arranging the chip 2C on the chips 2A and 2B which are arranged at positions deviated from the center of the substrate, if the number of pins on the chip 2C is large in comparison with the chips 2A and 2B and if it is necessary to loosen the pitch of bonding pads 9 corresponding to the pitch C, it is desirable to stack the chip 2C so as to approximate its center to the center of the package substrate 1 rather than to the center of the chip 2A.

Although the present invention has been described concretely on the basis of the above embodiments, it goes without saying that the present invention is not limited to the above embodiments, but that various changes may be made within the scope not departing from the gist of the invention.

Figure 46:
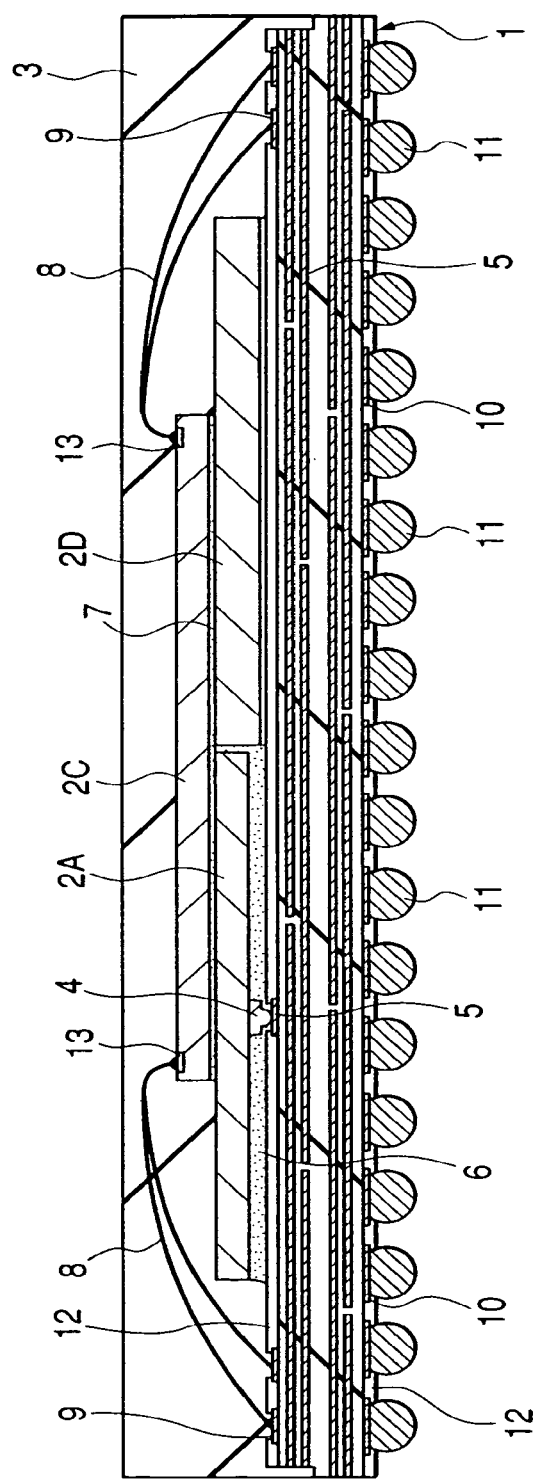
FIG. 46 is a sectional view of a semiconductor device according to a modification of the fourth embodiment.

For example, in case of combining a single chip 2A with DRAM formed thereon with a single chip 2C with MPU formed thereon to constitute a multi-chip module (MCM), for example as in the above fourth embodiment, there may be adopted such a method as shown in FIG. 46 wherein a single chip 2A with DRAM formed thereon and a dummy chip 2D are arranged side by side on the main surface of the package substrate 1 and the chip 2C is stacked on the two chips 2A and 2D. In this case, the dummy chip 2D is formed, for example, by dicing a mirror polish wafer not formed with an integrated circuit and by equalizing its thickness to the sum of the thickness of chip 2A and the height of Au bumps 4. Such a mounting method is effective for example in the case where an outside diameter of the overlying chip 2C is much larger than that of the underlying chip 2A and the overhanging quantity (h) of the overlying chip 2C relative to the underlying chip 2A described in connection with FIG. 39 cannot be set at a value of 1.5 mm or less.

The chip mounted on the package substrate by the flip-chip method is not limited to DRAM alone, flash memory alone, or a combination of DRAM and flash memory. Various memory chips may be combined arbitrarily such as DRAMs with each other, flash memories with each other, or a combination of DRAM or flash memory with SRAM (Static Random Access Memory). Also as to the chip to be stacked on the memory chips, no limitation is made to a microprocessor or ASIC, but there may be used a chip formed with LSI of a narrower pitch than memory chips. Further, the number of chips mounted on the package substrate is not limited to two or three.

On the package substrate there may be mounted other small-sized electronic parts than chips, such as capacitors and resistors. For example, by mounting a chip capacitor along the outer periphery of a memory chip, it is possible to diminish noise produced during operation of the memory chip and thereby attain a high-speed operation.

Further, various design modifications may be made within the scope not departing from the gist of the present invention, such as using a build-up substrate as a chip packaging substrate or attaching a heat dissipating cap to a part of the package substrate.

INDUSTRIAL APPLICABILITY

According to one preferred mode for carrying out the present invention it is possible to improve the reliability of a multi-chip module wherein on plural chips is stacked another chip and the chips are sealed with resin.

According to another preferred mode for carrying out the present invention it is possible to reduce the manufacturing cost of a multi-chip module wherein on plural chips is stacked another chip and the chips are sealed with resin.

The invention claimed is:

1. A semiconductor device comprising:
   a wiring substrate having a front surface, a first electrode pad formed on the front surface, a plating film formed on the first electrode pad, a rear surface opposite to the first surface, and a second electrode pad formed on the rear surface;
   a semiconductor chip having a main surface, and a bonding pad formed on the main surface, and mounted over the front surface of the wiring substrate;
   a conductive material electrically connecting the bonding pad of the semiconductor chip with the first electrode pad of the wiring substrate;
   a resin sealing the semiconductor chip; and
   a solder material connected with the second electrode pad of the wiring substrate,
   wherein the wiring substrate has a first side surface, a second side surface, and a wiring for electroplating,
   wherein the first side surface is located between the front surface and the rear surface, and is located at a furthermost peripheral portion side of the wiring substrate, and is not covered with the resin,
   wherein the second side surface is located at an inner side of the wiring substrate with respect to the first side surface, and is covered with the resin,
   wherein the wiring is electrically connected with the first electrode pad, and extends toward the second side surface,
   wherein an end face of the wiring exposed from the second side surface is covered with resin;
   wherein the second electrode pad is located at an inner side of the rear surface with respect to the first side surface, and
   wherein, in the wiring substrate, a thickness of a first part which includes the first side surface is less than a thickness of a second part which includes the second side surface and which is located adjacent to the inner side of the first part.

2. The semiconductor device according to claim 1, wherein the wiring is formed integrally with the first electrode pad.

3. The semiconductor device according to claim 2,
   wherein the wiring and the first electrode pad are formed by etching a copper foil attached to the front surface of the wiring substrate, and
   wherein the wiring and the first electrode pad are a part of an uppermost wiring layer of a plurality of wiring layers.

4. The semiconductor device according to claim 3, wherein the plating film includes a plating film composed of gold.

5. The semiconductor device according to claim 1, wherein the first side surface is a cutting surface formed by cutting the wiring substrate.

6. The semiconductor device according to claim 1,
   wherein a first insulating film is formed over the front surface of the wiring substrate,
   wherein a second insulating film is formed over the rear surface of the wiring substrate,
   wherein a surface of the first electrode pad is exposed from the first insulating film,
   wherein a surface of the wiring is covered with the first insulating film,
   wherein the end face of the firing is exposed from the first insulating film,
   wherein a surface of the second electrode pad is exposed from the second insulating film,
   wherein the conductive material is connected with the surface of the first electrode pad, and
   wherein the solder material is connected with the surface of the second pad.

* * * * *